US012642129B2

(12) United States Patent
Celano et al.

(10) Patent No.: US 12,642,129 B2
(45) Date of Patent: May 26, 2026

(54) ARRANGEMENTS OF MULTIPLE-CHIP LIGHT-EMITTING DIODE PACKAGES

(71) Applicant: CreeLED, Inc., Durham, NC (US)

(72) Inventors: Thomas Celano, Cary, NC (US); Alexis Rile, Durham, NC (US); Derek Miller, Columbus, OH (US); David Suich, Durham, NC (US); Colin Blakely, Raleigh, NC (US); Sarah Trinkle, Broadway, NC (US); Robert Wilcox, Rolesville, NC (US)

(73) Assignee: CreeLED, Inc., Durham, NC (US)

( * ) Notice: Subject to any disclaimer, the term of this patent is extended or adjusted under 35 U.S.C. 154(b) by 995 days.

(21) Appl. No.: 17/674,448

(22) Filed: Feb. 17, 2022

(65) Prior Publication Data

US 2023/0260972 A1 Aug. 17, 2023

(51) Int. Cl.
*H10W 90/00* (2026.01)
*H10H 20/853* (2025.01)
(Continued)

(52) U.S. Cl.
CPC .......... *H10W 90/00* (2026.01); *H10H 20/853* (2025.01); *H10H 20/856* (2025.01); *H10H 20/857* (2025.01)

(58) Field of Classification Search
CPC ..... H01L 25/0753; H01L 33/54; H01L 33/60; H01L 33/62; H01L 33/508; H01L 33/48;
(Continued)

(56) References Cited

U.S. PATENT DOCUMENTS

| | | |
|---|---|---|
| D100,040 S | 6/1936 | Petersen |
| D103,671 S | 3/1937 | Connor |

(Continued)

FOREIGN PATENT DOCUMENTS

| | | |
|---|---|---|
| CN | 102280539 A | 12/2011 |
| CN | 114256438 A | 3/2022 |

(Continued)

OTHER PUBLICATIONS

Notice of Allowance for Taiwanese Patent Application No. 112303066, mailed Feb. 19, 2024, 3 pages.
(Continued)

*Primary Examiner* — Chad M Dicke
*Assistant Examiner* — Gary Abel
(74) *Attorney, Agent, or Firm* — Withrow & Terranova, P.L.L.C.

(57) ABSTRACT

Light-emitting diode (LED) packages, and more particularly arrangements of multiple LED chips in LED packages are disclosed. Arrangements include different types, different dimensions, and/or different orientations of LED chips within LED packages and corresponding electrical connections. Further arrangements include individual cover structures having different dimensions for various LED chips to accommodate thickness variations of LED chips and/or thickness variations attributed to different elements of individual cover structures. Different cover structure elements may include lumiphoric materials, antireflective layers, filter layers, and polarization layers. By accounting for dimensional variations between LED chips and/or between cover structures within multiple-chip LED packages, aggregate light-emitting surfaces may be provided with improved emission uniformity.

23 Claims, 11 Drawing Sheets

(51) Int. Cl.
H10H 20/856 (2025.01)
H10H 20/857 (2025.01)

(58) Field of Classification Search
CPC .. H10H 20/853; H10H 20/856; H10H 20/857;
H10H 20/85; H10H 20/8516; H10H
29/853; H10H 29/49; H10H 29/857;
H10H 29/922; H10H 29/942; H10H
29/856; H10H 20/0362; H10H 20/852;
H10H 29/0362; H10H 29/852; H10H
29/142
See application file for complete search history.

(56) References Cited

U.S. PATENT DOCUMENTS

| | | | |
|---|---|---|---|
| D521,948 S | 5/2006 | Inoue | |
| D573,554 S | 7/2008 | Kobayakawa | |
| D574,336 S | 8/2008 | Okada et al. | |
| D575,244 S | 8/2008 | Lee | |
| D576,574 S | 9/2008 | Kobayakawa | |
| D596,592 S | 7/2009 | Yong et al. | |
| D602,451 S | 10/2009 | Gielen | |
| D615,504 S | 5/2010 | Keller et al. | |
| D615,505 S | 5/2010 | Butterworth et al. | |
| D623,151 S | 9/2010 | Hwang et al. | |
| D623,152 S | 9/2010 | Hwang et al. | |
| D642,142 S | 7/2011 | Kuwaharada et al. | |
| D649,943 S | 12/2011 | Kuwaharada et al. | |
| D650,342 S | 12/2011 | Kuwaharada et al. | |
| D650,343 S | 12/2011 | Andrews et al. | |
| D660,257 S | 5/2012 | Andrews et al. | |
| D667,802 S | 9/2012 | Otaki et al. | |
| D672,731 S | 12/2012 | Bergmann et al. | |
| D673,126 S | 12/2012 | Donofrio et al. | |
| D673,127 S | 12/2012 | Cho et al. | |
| D674,758 S | 1/2013 | Wu et al. | |
| D675,169 S | 1/2013 | Chou | |
| D691,973 S | 10/2013 | Donofrio et al. | |
| D697,642 S | 1/2014 | Amari et al. | |
| D704,154 S | 5/2014 | Andrews et al. | |
| D705,957 S | 5/2014 | Lin | |
| D711,841 S | 8/2014 | Britt et al. | |
| D712,849 S | 9/2014 | Britt et al. | |
| D713,804 S | 9/2014 | Britt et al. | |
| D718,258 S | 11/2014 | Lowes et al. | |
| 9,006,763 B2 | 4/2015 | Ueno et al. | |
| 9,070,850 B2 | 6/2015 | Keller et al. | |
| D738,832 S | 9/2015 | Hussell et al. | |
| D741,821 S | 10/2015 | Song | |
| D749,051 S | 2/2016 | Clark et al. | |
| 9,349,929 B2 | 5/2016 | Clark et al. | |
| D762,183 S | 7/2016 | Kim et al. | |
| D762,184 S | 7/2016 | Kiridoshi et al. | |
| D763,472 S | 8/2016 | Watson-Levack | |
| D763,473 S | 8/2016 | Watson-Levack | |
| 9,461,024 B2 | 10/2016 | Hussell et al. | |
| 9,515,055 B2 | 12/2016 | Britt et al. | |
| D777,122 S | 1/2017 | Bergmann et al. | |
| 9,627,361 B2 | 4/2017 | Andrews et al. | |
| D790,486 S | 6/2017 | Reiherzer et al. | |
| D800,679 S | 10/2017 | Omori | |
| 9,887,327 B2 | 2/2018 | Reiherzer et al. | |
| D833,989 S | 11/2018 | Tamura | |
| D844,576 S | 4/2019 | Miura | |
| 10,388,838 B2 | 8/2019 | Hung et al. | |
| 10,439,112 B2 | 10/2019 | Clark et al. | |
| 10,516,081 B1 | 12/2019 | Xin et al. | |
| 10,522,722 B2 | 12/2019 | Damborsky et al. | |
| 10,854,780 B2 | 12/2020 | Hung et al. | |
| D915,308 S | 4/2021 | Maruyama | |
| D915,309 S | 4/2021 | Maruyama | |
| D926,714 S | 8/2021 | Wilcox et al. | |
| 11,456,443 B2 | 9/2022 | Montgomery | |
| 11,552,229 B2 | 1/2023 | Damborsky et al. | |
| D996,377 S | 8/2023 | Celano et al. | |
| D996,378 S | 8/2023 | Trinkle et al. | |
| 2005/0173721 A1 | 8/2005 | Isoda | |
| 2006/0138945 A1* | 6/2006 | Wolk | H10K 59/38 |
| | | | 313/506 |
| 2007/0253209 A1 | 11/2007 | Loh et al. | |
| 2008/0054280 A1 | 3/2008 | Reginelli et al. | |
| 2009/0017566 A1 | 1/2009 | Basin et al. | |
| 2009/0101929 A1 | 4/2009 | Mo et al. | |
| 2010/0117099 A1* | 5/2010 | Leung | H01L 25/0753 |
| | | | 257/E21.023 |
| 2010/0140633 A1 | 6/2010 | Emerson | |
| 2010/0140634 A1 | 6/2010 | van de Ven et al. | |
| 2010/0252851 A1 | 10/2010 | Emerson et al. | |
| 2010/0258827 A1* | 10/2010 | Lee | H10H 20/018 |
| | | | 257/E33.064 |
| 2011/0062482 A1 | 3/2011 | Solomensky et al. | |
| 2011/0175117 A1 | 7/2011 | Jagt et al. | |
| 2011/0210358 A1 | 9/2011 | Kim et al. | |
| 2011/0220920 A1 | 9/2011 | Collins et al. | |
| 2012/0086024 A1 | 4/2012 | Andrews et al. | |
| 2012/0087108 A1 | 4/2012 | Ke et al. | |
| 2012/0112661 A1 | 5/2012 | van de Ven et al. | |
| 2013/0092960 A1 | 4/2013 | Wilcox et al. | |
| 2013/0105835 A1 | 5/2013 | Wu et al. | |
| 2013/0141920 A1 | 6/2013 | Emerson et al. | |
| 2013/0322068 A1 | 12/2013 | Clark et al. | |
| 2013/0322070 A1 | 12/2013 | Clark et al. | |
| 2013/0322088 A1 | 12/2013 | Huang et al. | |
| 2014/0131748 A1 | 5/2014 | Song | |
| 2014/0291715 A1 | 10/2014 | Reiherzer et al. | |
| 2014/0306246 A1* | 10/2014 | Chen | H01L 24/14 |
| | | | 257/88 |
| 2015/0179903 A1 | 6/2015 | Pun et al. | |
| 2015/0221839 A1 | 8/2015 | Park et al. | |
| 2016/0079478 A1 | 3/2016 | Kong et al. | |
| 2017/0069606 A1 | 3/2017 | Gould et al. | |
| 2017/0069806 A1 | 3/2017 | Kim et al. | |
| 2017/0084587 A1 | 3/2017 | Hung et al. | |
| 2017/0098746 A1 | 4/2017 | Bergmann et al. | |
| 2017/0179352 A1 | 6/2017 | Song | |
| 2017/0345801 A1* | 11/2017 | Lin | H01L 25/0753 |
| 2018/0151790 A1 | 5/2018 | Kim et al. | |
| 2018/0357948 A1* | 12/2018 | Chen | G09G 3/32 |
| 2019/0198709 A1 | 6/2019 | Wildeson et al. | |
| 2019/0326485 A1* | 10/2019 | Damborsky | H10H 20/84 |
| 2019/0355886 A9 | 11/2019 | Hussell | |
| 2019/0371974 A1* | 12/2019 | Hussell | H10H 20/852 |
| 2020/0105974 A1 | 4/2020 | Ozeki et al. | |
| 2020/0212277 A1 | 7/2020 | Ozeki et al. | |
| 2020/0313058 A1 | 10/2020 | Ukawa et al. | |
| 2020/0335673 A1 | 10/2020 | Kim et al. | |
| 2020/0411730 A1 | 12/2020 | Andrews et al. | |
| 2021/0028401 A1 | 1/2021 | Montgomery et al. | |
| 2021/0083153 A1 | 3/2021 | Kayama et al. | |
| 2022/0005987 A1* | 1/2022 | Wilcox | H10H 20/8582 |
| 2022/0139890 A1* | 5/2022 | Lin | H01L 25/0753 |
| | | | 257/79 |
| 2022/0165923 A1 | 5/2022 | Kamp et al. | |
| 2022/0415977 A1* | 12/2022 | Lee | H10K 59/35 |
| 2023/0140302 A1 | 5/2023 | Miller et al. | |
| 2023/0163261 A1* | 5/2023 | Lu | H10H 20/854 |
| | | | 438/29 |
| 2023/0261154 A1 | 8/2023 | Trinkle et al. | |

FOREIGN PATENT DOCUMENTS

| | | |
|---|---|---|
| JP | D1353072 A | 3/2009 |
| JP | 2018018994 A | 2/2018 |
| JP | D1655194 A | 3/2020 |
| TW | D140189 S | 4/2011 |
| TW | D141208 S | 6/2011 |
| TW | D149503 S | 10/2012 |
| TW | D157837 S | 12/2013 |
| TW | D170851 S | 10/2015 |
| TW | D188043 S | 1/2018 |
| WO | 2010035206 A1 | 4/2010 |

(56)                    References Cited

FOREIGN PATENT DOCUMENTS

| WO | 2018088671 A1 | 5/2018 |
| WO | 2021023532 A1 | 2/2021 |
| WO | 2021100454 A1 | 5/2021 |

OTHER PUBLICATIONS

Notice of Allowance for U.S. Appl. No. 29/877,887, mailed Mar. 6, 2024, 8 pages.
Examination Report for Taiwanese Patent Application No. 111303915, mailed Mar. 24, 2023, 4 pages.
Notice of Allowance for U.S. Appl. No. 29/829,994, mailed Mar. 15, 2023, 8 pages.
Notice of Allowance for U.S. Appl. No. 29/827,155, mailed Mar. 15, 2023, 9 pages.
Office Action for Chinese Patent Application No. 202230530277.0, mailed Jul. 21, 2023, 8 pages.
MG Chemicals, "Epoxy Potting Compunds," Technical Data Sheet, Sep. 27, 2021, MG Chemicals, web.archive/org/web/20210927001739/https://mgchemicals.com/products/potting-compounds/epoxy-potting/high-temperature-epoxy/, 3 pages.
MG Chemicals, "832HT: High Temperature Epoxy, Encapsulating and Potting Compound," Technical Data Sheet, Nov. 21, 2019, MG Chemicals, web.archive.org/web/20201028085732/https://mgchemicals.com/downloads/tds/tds-832ht-2parts.pdf, 2 pages.
Non-Final Office Action for U.S. Appl. No. 17/674,430, mailed Jul. 30, 2024, 22 pages.
Notice of Allowance for U.S. Appl. No. 29/877,879, mailed Aug. 26, 2024, 9 pages.
International Search Report and Written Opinion for International Patent Application No. PCT/US2023/018595, mailed Jul. 31, 2023, 13 pages.
International Search Report and Written Opinion for International Patent Application No. PCT/US2023/062635, mailed May 22, 2023, 13 pages.
Non-Final Office Action for U.S. Appl. No. 17/726,072, mailed Oct. 10, 2024, 7 pages.
Examination Report for Taiwanese Patent Application No. 112303066, mailed Oct. 19, 2023, 9 pages.
Preliminary Examination Report for Taiwanese Patent Application No. 112103007, mailed Sep. 20, 2023, 17 pages.
Notice of Allowance for Taiwanese Patent Application No. 111303915, mailed Sep. 1, 2023, 5 pages.
Notification to Grant for Chinese Patent Application No. 202230530277.0, mailed Feb. 22, 2024, 4 pages.
Office Action for Taiwanese Patent Application No. 112112910, mailed Feb. 22, 2024, 17 pages.
Notification to Grant for Chinese Patent Application No. 202430228569.8, mailed Nov. 27, 2024, 4 pages.
Reasons for Rejection for Taiwanese Patent Application No. 112112910, mailed Nov. 12, 2024, 8 pages.
Final Office Action for U.S. Appl. No. 17/674,430, mailed Dec. 27, 2024, 27 pages.

* cited by examiner

ARRANGEMENTS OF MULTIPLE-CHIP LIGHT-EMITTING DIODE PACKAGES

FIELD OF THE DISCLOSURE

The present disclosure relates to light-emitting diode (LED) packages, and more particularly to arrangements of multiple LED chips in LED packages.

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have enabled a variety of new display applications and are being increasingly utilized for general illumination applications, often replacing incandescent and fluorescent light sources.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An LED chip typically includes an active region that may be fabricated, for example, from silicon carbide, gallium nitride, gallium phosphide, indium phosphide, aluminum nitride, gallium arsenide-based materials, and/or from organic semiconductor materials. Photons generated by the active region are initiated in all directions.

Lumiphoric materials, such as phosphors, may be arranged in light emission paths of LED emitters to convert portions of light to different wavelengths. LED packages have been developed that can provide mechanical support, electrical connections, and encapsulation for LED emitters. Light emissions that exit surfaces of LED emitters typically interact with various elements or surfaces of the LED package and lumiphoric materials before exiting, thereby increasing opportunities for light loss and potential non-uniformity of light emissions. As such, there can be challenges in producing high quality light with desired emission characteristics while also providing high light emission efficiency in LED packages.

The art continues to seek improved LEDs and solid-state lighting devices having desirable illumination characteristics capable of overcoming challenges associated with conventional lighting devices.

SUMMARY

Aspects disclosed herein relate to light-emitting diode (LED) packages, and more particularly to arrangements of multiple LED chips in LED packages. Arrangements include different types, different dimensions, and/or different orientations of LED chips within LED packages and corresponding electrical connections. Further arrangements include individual cover structures having different dimensions for various LED chips to accommodate thickness variations of LED chips and/or thickness variations attributed to different elements of individual cover structures. Different cover structure elements may include lumiphoric materials, anti-reflective layers, filter layers, and polarization layers. By accounting for dimensional variations between LED chips and/or between cover structures within multiple-chip LED packages, aggregate light-emitting surfaces may be provided with improved emission uniformity.

In one aspect, an LED package comprises: a submount including a first side and a second side that opposes the first side; a plurality of metal traces on the first side of the submount; and a plurality of LED chips mounted on the first side and electrically coupled with the plurality of metal traces, wherein: a first LED chip of the plurality of LED chips is mounted to and electrically coupled with a first trace of the plurality of traces, and the first LED chip is further electrically coupled with a second trace of the plurality of traces by a wire bond; and a second LED chip of the plurality of LED chips is mounted to and electrically coupled to a third trace and a fourth trace of the plurality of traces. In certain embodiments, the first trace is electrically coupled with a fifth trace of the plurality of traces by a jumper wire bond. In certain embodiments, the first trace, the second trace, the wire bond, the fifth trace, and the jumper wire bond form an electrically conductive path for the first LED chip that extends along the first side from a peripheral edge of the submount to an opposing peripheral edge of the submount. The LED package may further comprise a cover structure that is registered with the second LED chip, wherein: a height of the first LED chip above the submount is greater than a height of the second LED chip above the submount; and a height of the cover structure is within 20% of the height of the first LED chip. In certain embodiments, the height of the cover structure is within 5% of the height of the first LED chip. In certain embodiments, the cover structure comprises a lumiphoric material and a support element that is light-transmissive to light from the second LED chip and the lumiphoric material.

In another aspect, an LED package comprises: a submount including a first side and a second side that opposes the first side; a first LED chip and a second LED chip arranged on the first side of the submount; and a cover structure that is provided on the second LED chip such that the second LED chip is arranged between the cover structure and the submount, wherein a height of the first LED chip above the submount is greater than a height of the second LED chip above the submount, and a height of the cover structure above the submount is within 10% of the height of the first LED chip. In certain embodiments, the height of the cover structure is within 5% of the height of the first LED chip. In certain embodiments, the cover structure comprises a lumiphoric material and a support element that is light-transmissive to light from the second LED chip and the lumiphoric material. The LED package may further comprise a third LED chip arranged on the first side of the submount and an additional cover structure that is arranged on the third LED chip, wherein the height of the first LED chip above the submount is greater than a height of the third LED chip above the submount, and a height of the additional cover structure above the submount is within 10% of the height of the first LED chip. In certain embodiments, the additional cover structure comprises a lumiphoric material than is different from the lumiphoric material of the cover structure. In certain embodiments, the second LED chip and the lumiphoric material of the cover structure are configured to provide white light that is a mixture of light from the second LED chip and the lumiphoric material; and the third LED chip and the lumiphoric material of the additional cover structure are configured to provide light that is primarily a single color such that a majority of light that exits the additional cover structure comprises wavelength-converted light. The LED package may further comprise a light-altering material on sidewalls of the first LED chip and the second LED chip and on portions of the submount that are outside mounting areas of the first LED chip and the second LED chip. The LED package may further comprise an encapsulant this is arranged on the light-altering material, the first LED chip, and the cover structure. In certain embodiments, the light-altering material is arranged to entirely extend from the first LED chip and the second LED chip to peripheral edges of the submount. In certain embodiments, the light-altering material is arranged to only partially extend from the first LED chip and the second LED chip toward peripheral edges of the submount. The LED package may further comprise a dam on the submount that defines boundaries of the light-altering material. In certain embodiments, peripheral edges of the light-altering material form a non-geometric shape along the submount.

In another aspect, an LED package comprises: a submount; a first LED chip and a second LED chip that are arranged on the submount; a first cover structure on the first LED chip, the first cover structure comprising a first support element that is transmissive to light generated by the first LED chip; and a second cover structure on the second LED chip, the second cover structure comprising a second support element that is transmissive to light generated by the second LED chip; wherein the first support element comprises a thickness that is different than a thickness of the second support element, and a height of the first cover structure above the submount is within 10% of a height of the second cover structure above the submount. In certain embodiments, the first cover structure comprises a lumiphoric material. In certain embodiments, the first cover structure comprises a first optical layer that includes one or more of an antireflective layer, a filter layer, and a polarization layer. In certain embodiments, the second cover structure comprises a second optical layer that includes one or more of an antireflective layer, a filter layer, and a polarization layer. The LED package may further comprise a light-altering material on sidewalls of the first LED chip and the second LED chip and on portions of the submount that are outside mounting areas of the first LED chip and the second LED chip. The LED package may further comprise an encapsulant that is arranged on the light-altering material, the first cover structure, and the second cover structure.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

5

Figure 1A:
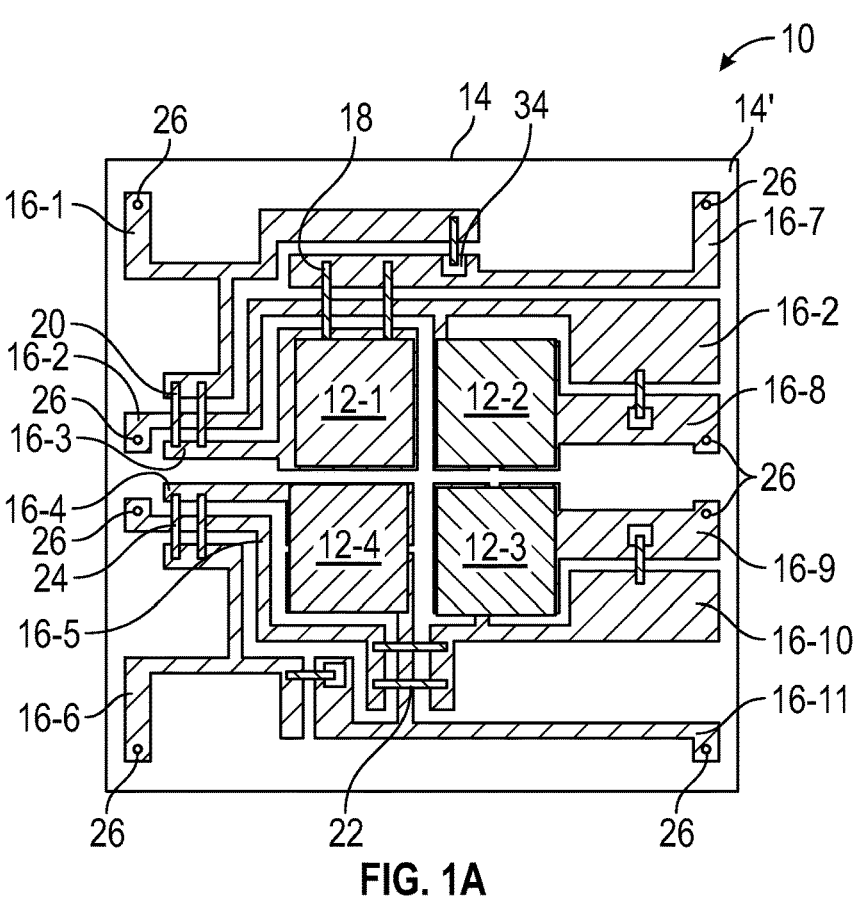
FIG. 1A is a top view of a light-emitting diode (LED) package where multiple LED chips are assembled in close proximity to one another on a submount.

6 layer of one or more antireflective layers, one or more filter layers, one or more polarization layers, or combinations thereof.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

Aspects disclosed herein relate to light-emitting diode (LED) packages, and more particularly to arrangements of multiple LED chips in LED packages. Arrangements include different types, different dimensions, and/or different orientations of LED chips within LED packages and corresponding electrical connections. Further arrangements include individual cover structures having different dimensions for various LED chips to accommodate thickness variations of LED chips and/or thickness variations attributed to different elements of individual cover structures. Different cover structure elements may include lumiphoric materials, antireflective layers, filter layers, and polarization layers. By accounting for dimensional variations between LED chips and/or between cover structures within multiple-chip LED packages, aggregate light-emitting surfaces may be provided with improved emission uniformity.

Before delving into specific details of various aspects of the present disclosure, an overview of various elements that may be included in exemplary LEDs of the present disclosure is provided for context. An LED chip typically comprises an active LED structure or region that can have many different semiconductor layers arranged in different ways. The fabrication and operation of LEDs and their active structures are generally known in the art and are only briefly discussed herein. The layers of the active LED structure can be fabricated using known processes with a suitable process being fabrication using metal organic chemical vapor deposition. The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including, but not limited to, buffer layers, nucleation layers, super lattice structures, undoped layers, cladding layers, contact layers, and current-spreading layers and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen (N) and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include silicon carbide (SiC), organic semiconductor materials, and other Group III-V systems such as gallium phosphide (GaP), gallium arsenide (GaAs), indium phosphide (InP), and related compounds.

The active LED structure may be grown on a growth substrate that can include many materials, such as sapphire, SiC, aluminum nitride (AlN), GaN, GaAs, glass, or silicon. SiC has certain advantages, such as a closer crystal lattice match to Group III nitrides than other substrates and results in Group III nitride films of high quality. SiC also has a very high thermal conductivity so that the total output power of Group III nitride devices on SiC is not limited by the thermal dissipation of the substrate. Sapphire is another common substrate for Group III nitrides and also has certain advantages, including being lower cost, having established manufacturing processes, and having good light-transmissive optical properties.

Different embodiments of the active LED structure can emit different wavelengths of light depending on the composition of the active layer and n-type and p-type layers. In some embodiments, the active LED structure emits blue light with a peak wavelength range of approximately 430 nanometers (nm) to 480 nm. In other embodiments, the active LED structure emits green light with a peak wavelength range of 500 nm to 570 nm. In other embodiments, the active LED structure emits red light with a peak wavelength range of 600 nm to 650 nm. In certain embodiments, the active LED structure may be configured to emit light that is outside the visible spectrum, including one or more portions of the ultraviolet (UV) spectrum. The UV spectrum is typically divided into three wavelength range categories denoted with letters A, B, and C. In this manner, UV-A light is typically defined as a peak wavelength range from 315 nm to 400 nm, UV-B is typically defined as a peak wavelength range from 280 nm to 315 nm, and UV-C is typically defined as a peak wavelength range from 100 nm to 280 nm. UV LEDs are of particular interest for use in applications related to the disinfection of microorganisms in air, water, and surfaces, among others. In other applications, UV LEDs may also be provided with one or more lumiphoric materials to provide LED packages with aggregated emissions having a broad spectrum and improved color quality for visible light applications.

An LED chip can also be covered with one or more lumiphoric materials (also referred to herein as lumiphors), such as phosphors, such that at least some of the light from the LED chip is absorbed by the one or more lumiphors and is converted to one or more different wavelength spectra according to the characteristic emission from the one or more lumiphors. In this regard, at least one lumiphor receiving at least a portion of the light generated by the LED source may re-emit light having different peak wavelength than the LED source. An LED source and one or more lumiphoric materials may be selected such that their combined output results in light with one or more desired characteristics such as color, color point, intensity, spectral density, etc. In certain embodiments, aggregate emissions of LED chips, optionally in combination with one or more lumiphoric materials, may be arranged to provide cool white, neutral white, or warm white light, such as within a color temperature range of 2500 Kelvin (K) to 10,000 K. In certain embodiments, lumiphoric materials having cyan, green, amber, yellow, orange, and/or red peak wavelengths may be used. In certain embodiments, the combination of the LED chip and the one or more lumiphors (e.g., phosphors) emits a generally white combination of light. The one or more phosphors may include yellow (e.g., YAG:Ce), green (e.g., LuAg:Ce), and red (e.g., $Ca_{i-x-y}Sr_xEu_yAlSiN_3$) emitting phosphors, and combinations thereof. In other embodiments, the LED chip and corresponding lumiphoric material may be configured to primarily emit converted light from the lumiphoric material so that aggregate emissions include little to no perceivable emissions that correspond to the LED chip itself.

Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, inkjet printing, or the like). In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips. One or more lumiphoric materials may be provided on one or more portions of an LED chip in various configurations. In certain embodiments, lumiphoric materials may be provided over one or more surfaces of LED chips, while other surfaces of such LED chips may be devoid of lumiphoric material. In certain embodiments, a top surface of an LED chip may include lumiphoric material, while one or more side surfaces of an LED chip may be devoid of lumiphoric material. In certain embodiments, all or substantially all outer surfaces of an LED chip (e.g., other than contact-defining or mounting surfaces) may be coated or otherwise covered with one or more lumiphoric materials. In certain embodiments, one or more lumiphoric materials may be arranged on or over one or more surfaces of an LED chip in a substantially uniform manner. In other embodiments, one or more lumiphoric materials may be arranged on or over one or more surfaces of an LED chip in a manner that is non-uniform with respect to one or more of material composition, concentration, and thickness. In certain embodiments, the loading percentage of one or more lumiphoric materials may be varied on or among one or more outer surfaces of an LED chip. In certain embodiments, one or more lumiphoric materials may be patterned on portions of one or more surfaces of an LED chip to include one or more stripes, dots, curves, or polygonal shapes. In certain embodiments, multiple lumiphoric materials may be arranged in different discrete regions or discrete layers on or over an LED chip.

In certain embodiments, one or more lumiphoric materials may be provided as at least a portion of a wavelength conversion element or cover structure that is provided over an LED chip. Wavelength conversion elements or cover structures may include a support element and one or more lumiphoric materials that are provided by any suitable means, such as by coating a surface of the support element or by incorporating the lumiphoric materials within the support element. In some embodiments, the support element may be composed of a transparent material, a semi-transparent material, or a light-transmissive material, such as sapphire, SiC, silicone, and/or glass (e.g., borosilicate and/or fused quartz). Wavelength conversion elements and cover structures of the present disclosure may be formed from a bulk material which is optionally patterned and then singulated. In certain embodiments, the patterning may be performed by an etching process (e.g., wet or dry etching), or by another process that otherwise alters a surface, such as with a laser or saw. In certain embodiments, wavelength conversion elements and cover structures may be thinned before or after the patterning process is performed. In certain embodiments, wavelength conversion elements and cover structures may comprise a generally planar upper surface that corresponds to a light emission area of the LED package.

Wavelength conversion elements and cover structures may be attached to one or more LED chips using, for example, a layer of transparent adhesive. In certain embodiments, the layer of the transparent adhesive may include silicone with a refractive index in a range of about 1.3 to about 1.6 that is less than a refractive index of the LED chip on which the wavelength conversion element is placed. In various embodiments, wavelength conversion elements may comprise configurations such as phosphor-in-glass or ceramic phosphor plate arrangements. Phosphor-in-glass or ceramic phosphor plate arrangements may be formed by mixing phosphor particles with glass frit or ceramic materials, pressing the mixture into planar shapes, and firing or sintering the mixture to form a hardened structure that can be cut or separated into individual wavelength conversion elements.

As used herein, a layer or region of a light-emitting device may be considered to be "transparent" when at least 80% of emitted radiation that impinges on the layer or region emerges through the layer or region. Moreover, as used herein, a layer or region of an LED is considered to be "reflective" or embody a "mirror" or a "reflector" when at least 80% of the emitted radiation that impinges on the layer or region is reflected. In some embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (Ag) may be considered a reflective material (e.g., at least 80% reflective). In the case of UV LEDs, appropriate materials may be selected to provide a desired, and in some embodiments high, reflectivity and/or a desired, and in some embodiments low, absorption. In certain embodiments, a "light-transmissive" material may be configured to transmit at least 50% of emitted radiation of a desired wavelength.

The present disclosure can be useful for LED chips having a variety of geometries, such as vertical geometry or lateral geometry. A vertical geometry LED chip typically includes anode and cathode connections on opposing sides or faces of the LED chip. A lateral geometry LED chip typically includes both anode and cathode connections on the same side of the LED chip that is opposite a substrate, such as a growth substrate. In certain embodiments, a lateral geometry LED chip may be mounted on a submount of an LED package such that the anode and cathode connections are on a face of the LED chip that is opposite the submount. In this configuration, wirebonds may be used to provide electrical connections with the anode and cathode connections. In other embodiments, a lateral geometry LED chip may be flip-chip mounted on a surface of a submount of an LED package such that the anode and cathode connections are on a face of the active LED structure that is adjacent to the submount. In this configuration, electrical traces or patterns may be provided on the submount for providing electrical connections to the anode and cathode connections of the LED chip. In a flip-chip configuration, the active LED structure is configured between the substrate of the LED chip and the submount for the LED package. Accordingly, light emitted from the active LED structure may pass through the substrate in a desired emission direction. In other embodiments, an active LED structure may be bonded to a carrier submount, and the growth substrate may be removed such that light may exit the active LED structure without passing through the growth substrate.

According to aspects of the present disclosure, LED packages may include one or more elements, such as lumiphoric materials, encapsulants, light-altering materials, lenses, and electrical contacts, among others, that are provided with one or more LED chips. In certain aspects, an LED package may include a support member, such as a submount or a leadframe. Suitable materials for the submount include, but are not limited to, ceramic materials such as aluminum oxide or alumina, AlN, or organic insulators like polyimide (PI) and polyphthalamide (PPA). In other embodiments, a submount may comprise a printed circuit board (PCB), sapphire, Si or any other suitable material. For PCB embodiments, different PCB types can be used such as standard FR-4 PCB, metal core PCB, or any other type of PCB. In still further embodiments, the support structure may embody a lead frame structure. Light-altering materials may be arranged within LED packages to reflect or otherwise redirect light from the one or more LED chips in a desired emission direction or pattern.

As used herein, light-altering materials may include many different materials including light-reflective materials that reflect or redirect light, light-absorbing materials that absorb light, and materials that act as a thixotropic agent. As used herein, the term "light-reflective" refers to materials or particles that reflect, refract, scatter, or otherwise redirect light. For light-reflective materials, the light-altering material may include at least one of fused silica, fumed silica, titanium dioxide ($TiO_2$), or metal particles suspended in a binder, such as silicone or epoxy. In certain aspects, the particles may have an index or refraction that is configured to refract light emissions in a desired direction. In certain aspects, light-reflective particles may also be referred to as light-scattering particles. A weight ratio of the light-reflective particles or scattering particles to a binder may comprise a range of about 0.15:1 to about 0.5:1, or in a range of about 0.5:1 to about 1:1, or in a range of about 1:1 to about 2:1, depending on a desired viscosity before curing. For light-absorbing materials, the light-altering material may include at least one of carbon, silicon, or metal particles suspended in a binder, such as silicone or epoxy. The light-reflective materials and the light-absorbing materials may comprise nanoparticles. In certain embodiments, the light-altering material may comprise a generally white color to reflect and redirect light. In other embodiments, the light-altering material may comprise a generally opaque color, such as black or gray for absorbing light and increasing contrast. In certain embodiments, the light-altering material includes both light-reflective material and light-absorbing material suspended in a binder.

LED packages have been developed that include multiple LED chips that are clustered together to provide increased light output and/or the capability for a single LED package to emit multiple colors and/or peak wavelengths of light. Relative sizes or areas of individual LED chips within an LED package may be selected according to desired emission intensities and profiles. In certain embodiments, the LED chips within an LED package may have smaller sizes such as 0.5 millimeters (mm) by 0.5 mm and/or larger sizes such as 2 mm by 2 mm, or other ranges from 0.5 mm by 0.5 mm to 1 mm by 1 mm. In certain embodiments, a longest lateral dimension of each LED chip may be in a range from 0.5 mm to 2 mm, or in a range from 1 mm to 2 mm, or in a range from 0.5 mm to 1 mm. In such ranges where at least one dimension is 0.5 mm or greater, the LED chips may be well suited for providing high output powers in a compact footprint.

For multiple color applications, multiple individually formed LED chips are typically grouped together within a common LED package. However, separately formed LED chips may have sizes, shapes, emission profiles, and/or voltage requirements that vary, particularly for LED chips that emit different peak wavelengths. Such variations can lead to nonuniform light emissions, particularly when various LED chips having differing heights are arranged within a same LED package, thereby forming an aggregate light-emitting surface for the LED package with a variable height. According to aspects of the present disclosure, LED package arrangements are provided where different combinations of LED chip types and/or LED chip orientations are arranged together while also providing a substantially uniform height for an aggregate light-emitting surface of the LED package. In further aspects, different types of lumiphoric materials and/or LED chip covers may be arranged together with one or more types or orientations of LED chips while also providing a substantially uniform height for an aggregate light-emitting surface of the LED package. Exemplary LED chip covers including various combinations of light-transmissive materials, lumiphoric materials, textured surfaces, light-filtering structures, polarization structures, antireflective structures, and other forms of beam shaping.

FIG. 1A is a top view of an LED package 10 where multiple LED chips 12-1 to 12-4 are assembled in close proximity to one another on a submount 14. The LED chips 12-1 to 12-4 may include various combinations of chip types and/or LED chip orientations. For example, different chip types may include a first LED chip 12-1 being configured to emit red wavelengths of light, a second LED chip 12-2 being configured to emit green wavelengths of light, a third LED chip 12-3 being configured to emit blue wavelengths of light, and a fourth LED chip 12-4 being configured to emit a combination of blue wavelengths of light along with wavelength-converted light from a lumiphoric material that is registered with the fourth LED chip 12-4. In order to provide different chip types of different emission wavelengths, structures and/or orientations of the LED chips 12-1 to 12-4 may be different from one another. For example, the first LED chip 12-1 may be arranged with a vertical orientation with electrical connections made on opposing sides while the LED chips 12-2 to 12-4 may be arranged with flip-chip orientations where electrical connections are made from a same side of the LED chips 12-2 to 12-4 at the interface with the submount 14.

The top view provided in FIG. 1A is from a perspective of a first side 14', or top side, of the submount 14 on which the LED chips 12-1 to 12-4 are mounted. A plurality of metal traces 16-1 to 16-11 forming a pattern is arranged on the first side 14' of the submount 14 for providing electrical connections to each of the LED chips 12-1 to 12-4, regardless of orientation. The metal traces 16-1 to 16-11 may include any number of metals and/or metal layers, including copper (Cu), nickel (Ni), palladium (Pd), gold (Au), or alloys thereof, among others. In certain embodiments, the metal traces 16-1 to 16-11 are arranged to provide separated electrical connections to each of the LED chip 12-1 to 12-4 so that the LED chips 12-1 to 12-4 are independently controllable with respect to one another. Since the first LED chip 12-1 is configured with a vertical orientation, a first electrical connection for the LED chip 12-1 may be provided by the metal trace 16-3 to which the bottom side of the LED chip 12-1 is mounted and a second electrical connection for the LED chip 12-1 may be provided by the metal trace 16-7 that is laterally spaced from the LED chip 12-1. In this manner, one or more wire bonds 18 may electrically connect the top side of the LED chip 12-1 to the metal trace 16-7. The wire bonds 18 may extend over the metal trace 16-2 such that the LED chip 12-1 is electrically isolated from the metal trace 16-2. In contrast, each of the LED chips 12-2 to 12-4 may be flip-chip mounted to a different pair of metal traces (e.g., 16-2 and 16-8 for the LED chip 12-2, 16-9 and 16-10 for the LED chip 12-3, and 16-4 and 16-11 for the LED chip 12-4).

In order to accommodate a combination of vertical and flip-chip orientations for the LED chips 12-1 to 12-4, the metal traces 16-1 to 16-11 may include more traces than what is typically required for independently controllable electrical connections. In conventional applications, four LED chips may require 8 separate electrical connections to provide independently controllable functionality. As illustrated in FIG. 1A, electrical paths along the first side 14' for certain ones of the LED chips 12-1, 12-3, 12-4 may include more than two metal traces. For example, the LED chip 12-1 with vertical orientation is mounted on and electrically coupled with the metal trace 16-3. The metal trace 16-3 is then electrically coupled with the metal trace 16-1 by way of one or more first jumper wire bonds 20. The jumper wire bonds 20 may be arranged over and electrically isolated from the metal trace 16-2. In this regard, electrical connections for the LED chip 12-1 include three metal traces 16-1, 16-3, and 16-7 that form an electrically conductive path that traverses between two opposing edges of the submount 14. In a similar manner, an electrically conductive path for the LED chip 12-3 includes three metal traces 16-5, 16-9, 16-10 and second jumper wire bonds 22, and an electrically conductive path for the LED chip 12-4 includes three metal traces 16-4, 16-6, 16-11 and third jumper wire bonds 24. In contrast, an electrically conductive path for the LED chip 12-2 includes only two metal traces 16-2, 16-8. Notably, each of the above-described electrically conductive paths is arranged to traverse between two opposing edges of the submount 14. At each of the opposing edges, electrically conductive vias 26 may be provided that route the electrically conductive paths through the submount 14. In certain embodiments, electrical overstress elements 34, such as electrostatic discharge (ESD) chips or Zener diodes, may be arranged in electrical paths for one or more of the LED chips 12-1 to 12-4.

Figure 1B:
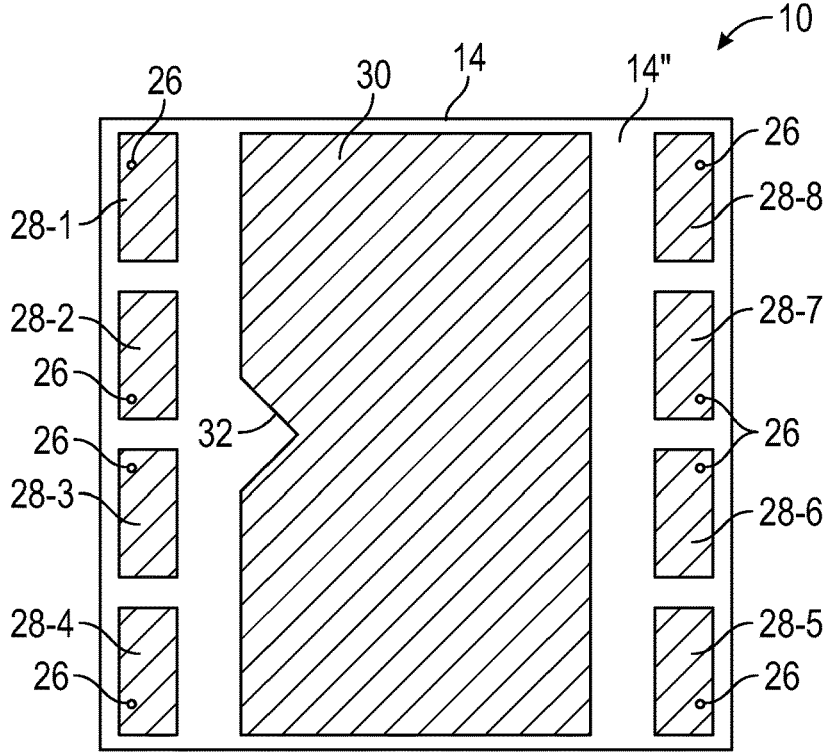
FIG. 1B is a bottom view of the LED package of FIG. 1A illustrating an arrangement of mounting pads and a thermal pad of the LED package.

FIG. 1B is a bottom view of the LED package 10 of FIG. 1A illustrating an arrangement of mounting pads 28-1 to 28-8 and a thermal pad 30. The bottom view provided in FIG. 1B is from a perspective of a second side 14", or bottom side, of the submount 14 that is opposite the first side 14'. The mounting pads 28-1 to 28-8 include two pairs for each of the LED chips 12-1 to 12-4 of FIG. 1A that are electrically connected to different ones of the metal traces 16-1, 16-2, 16-5, 16-6, 16-7, 16-8, 16-9, and 16-11 of FIG. 1A by way of the vias 26. For example, the mounting pad 28-1 may be electrically coupled to the metal trace 16-7 while the mounting pad 28-8 may be electrically coupled to the metal trace 16-1. In this manner, the mounting pads 28-1, 28-8 form anode and cathode connections for the LED chip 12-1. Similar arrangements may be provided for the other LED chips 12-2 to 12-4 by way of the mounting pads 28-2 to 28-7. The thermal pad 30, when present, may embody an electrically isolated metal trace that occupies a large area of the submount 14 on the second side 14" to provide heat dissipation. In certain embodiments, the thermal pad 30 may include a polarity indicator 32 in the form of a notch or other shape.

Figure 2:
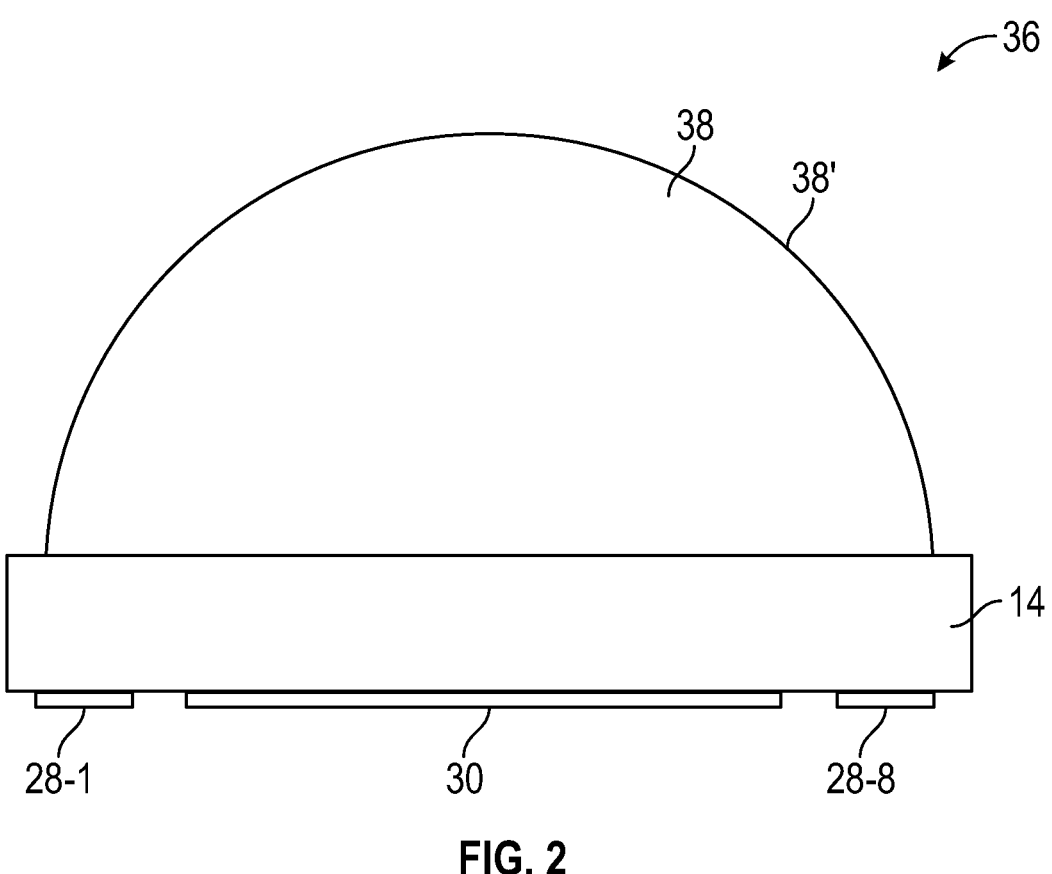
FIG. 2 is a side view of an LED package that is similar to the LED package of FIGS. 1A and 1B with the addition of an encapsulant on the submount.
Figure 3:
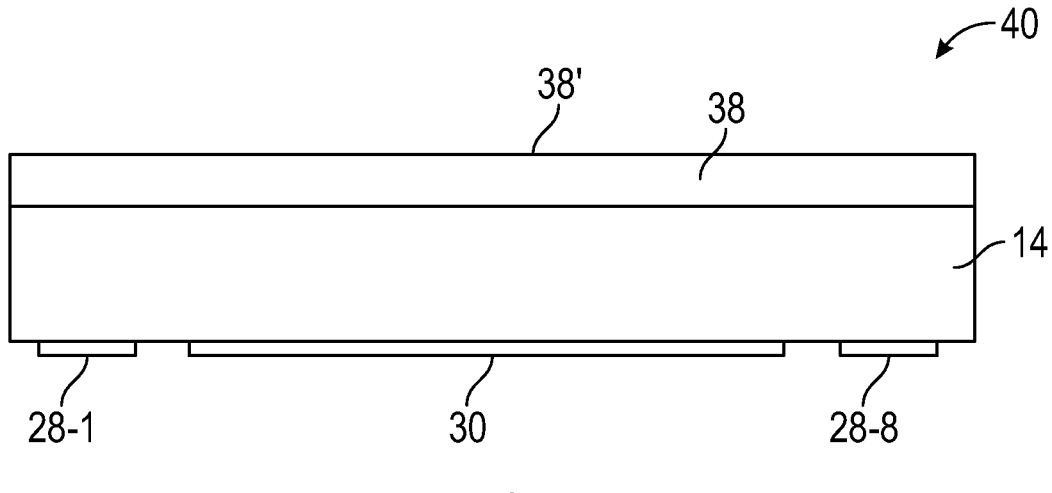
FIG. 3 is a side view of an LED package that is also similar to the LED package of FIGS. 1A and 1B and includes a shape for the encapsulant that is different than the LED package of FIG. 2.

FIG. 2 is a side view of an LED package 36 that is similar to the LED package 10 of FIGS. 1A and 1B with the addition of an encapsulant 38 on the submount 14. FIG. 3 is a side view of an LED package 40 that is also similar to the LED package 10 of FIGS. 1A and 1B and includes a different shape for the encapsulant 38 than the LED package of FIG. 2. The encapsulant 38, or encapsulant layer, may be provided to encapsulate the LED chips 12-1 to 12-4 and one or more portions of the metal traces 16-1 to 16-11 of FIG. 1A. The encapsulant 38 may contact, or directly contact, one or more portions of the submount 14. Many different materials may be used for the encapsulant 38, including silicones, plastics, epoxies or glass, with a suitable material being compatible with molding processes. Silicone is suitable for molding and provides suitable optical transmission properties for light emissions.

As illustrated in FIG. 2, the encapsulant 38 may be molded into the shape of a lens having an outer surface 38' that is curved to shape combined spectral outputs of the LED package 36. In this regard, the encapsulant 38 may be configured to shape, collimate, and/or mix different peak wavelengths of light generated within the LED package 36. Different molding techniques may provide the encapsulant 38 with many different shapes depending on desired light output, including hemispheric, ellipsoid bullet, flat, hex-shaped and square. In certain embodiments, a suitable shape for the encapsulant 38 includes both curved and planar surfaces, such as a hemispheric top portion with planar side surfaces. As illustrated in FIG. 3, the outer surface 38' may be formed as a flat surface or flat lens above the submount 14. Unless otherwise specified for any of the embodiments of the present disclosure, the principles of the present disclosure may be applicable to any shape of the encapsulant 38, including curved and/or flat lens shapes.

Figure 4A:
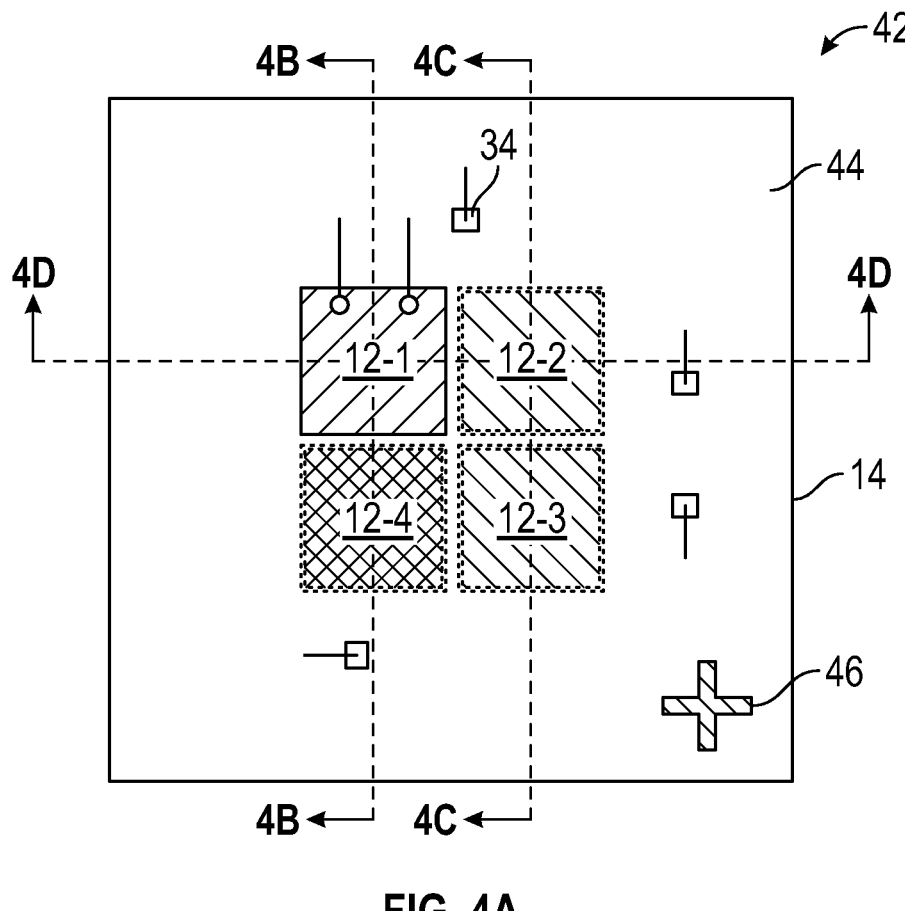
FIG. 4A is a top view of an LED package that is similar to the LED package of FIGS. 1A and 1B and further includes a light-altering material that is arranged to cover portions of the submount that are outside the LED chips.

FIG. 4A is a top view of an LED package 42 that is similar to the LED package 10 of FIGS. 1A and 1B and further includes a light-altering material 44 that is arranged to cover portions of the submount 14 that are outside the LED chips 12-1 to 12-4. The light-altering material 44 may be formed with a light-reflective and/or light-refractive material so that light from the LED chips 12-1 to 12-4 may be redirected toward a desired emission direction for the LED package 42 with reduced light loss. In certain embodiments, the light-altering material 44 may be configured with a generally white color. As illustrated, the light-altering material 44 is arranged to extend from peripheral edges of the submount 14 to peripheral edges of each of the LED chips 12-1 to 12-4, and in between neighboring ones of the LED chips 12-1 to 12-4. In this regard, an aggregate light-emitting surface for the LED package 42 may be collectively formed by the top surfaces of the LED chips 12-1 to 12-4. While the electrical overstress elements 34 may be visible from the top view of FIG. 4A, the light-altering material 44 may be arranged to cover them over the submount 14. A polarity indicator 46 may be etched or otherwise formed on a surface of the light-altering material 44. In other embodiments, the polarity indicator 46 may be omitted.

Figure 4B:
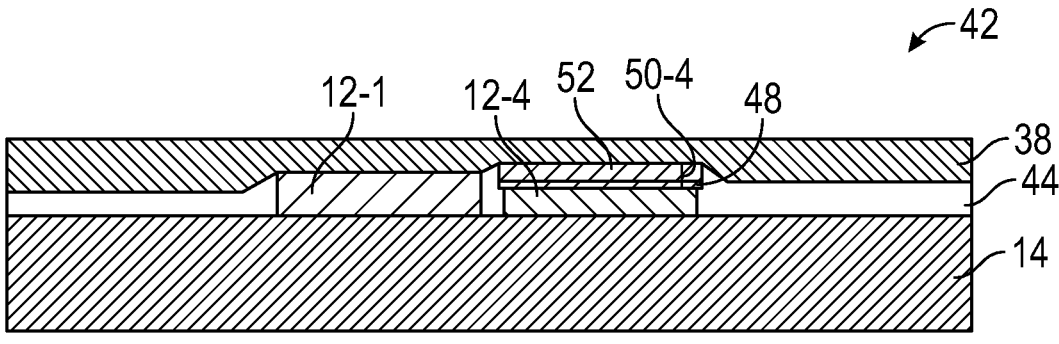
FIG. 4B is a cross-section of the LED package taken along the sectional line 4B-4B of FIG. 4A that includes the first LED chip and the fourth LED chip.

FIG. 4B is a cross-section of the LED package 42 taken along the sectional line 4B-4B of FIG. 4A that includes the first LED chip 12-1 and the fourth LED chip 12-4. In certain embodiments, the first LED chip 12-1 may be configured to emit wavelengths of a single color, such as red, and the fourth LED chip 12-4 may be configured to provide white emissions that are a combination of wavelengths of multiple colors emitted by the LED chip 12-4 and a lumiphoric material 48. The LED chip 12-4 may emit blue wavelengths of light and the lumiphoric material 48 may comprise yellow, green, and or red phosphor materials. In this manner, the LED chips 12-1 and 12-4 may be arranged with different mounting orientations, such as vertical for the LED chip 12-1 and flip-chip for the LED chip 12-4, and other configurations such as different material types and overall dimensions. For example, the first LED chip 12-1 may be arranged with a height above the submount 14 that is notably larger, such as more than 25%, than a corresponding height of the LED chip 12-4. In order to avoid an uneven light-emitting surface for the LED package 42, a cover structure 50-4 may be provided with a suitable thickness such that a height of the cover structure 50-4 is within 20%, or 10%, or 5%, or 1% of a height of the LED chip 12-1. The cover structure 50-4 may include a support element 52 and the lumiphoric material 48. The support element 52 may embody a superstrate as previously described. In certain embodiments, the support element 52 comprises a light-transmissive material to light emitted by the LED chip 12-4 and/or light generated by the lumiphoric material 48, such as glass, sapphire, or the like. As illustrated, the cover structure 50-4 is positioned on the LED chip 12-4 such that the LED chip 12-4 is arranged between the cover structure 50-4 and the submount 14. The cover structure 50-4 may extend a small amount past lateral edges of the LED chip 12-4 while maintaining a gap with the LED chip 12-1. The light-altering material 44 may be arranged on portions of the submount 14 that are outside mounting areas of the LED chips 12-1, 12-4, and the encapsulant 38 may be provided on the light-altering material 44, on the LED chips 12-1, 12-4, and on the cover structure 50-4.

Figure 4C:
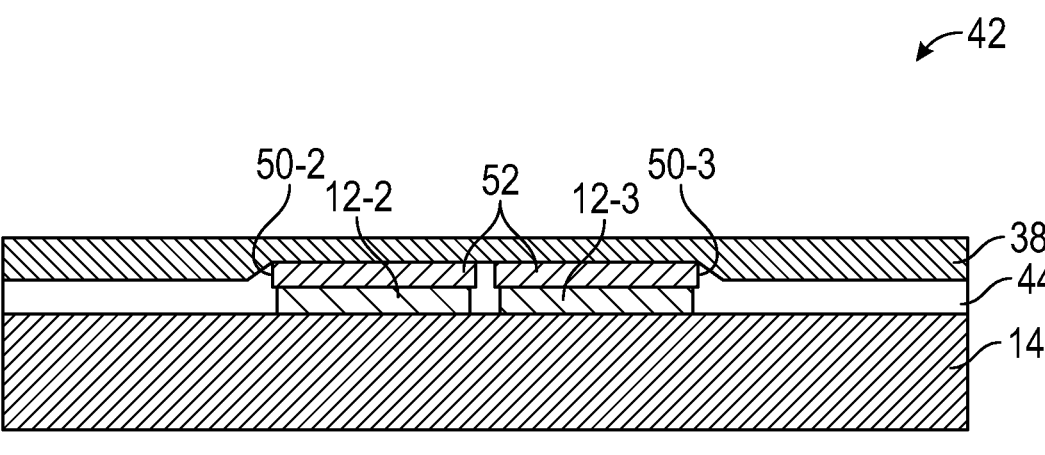
FIG. 4C is a cross-section of the LED package taken along the sectional line 4C-4C of FIG. 4A that includes the second LED chip and the third LED chip.
Figure 4D:
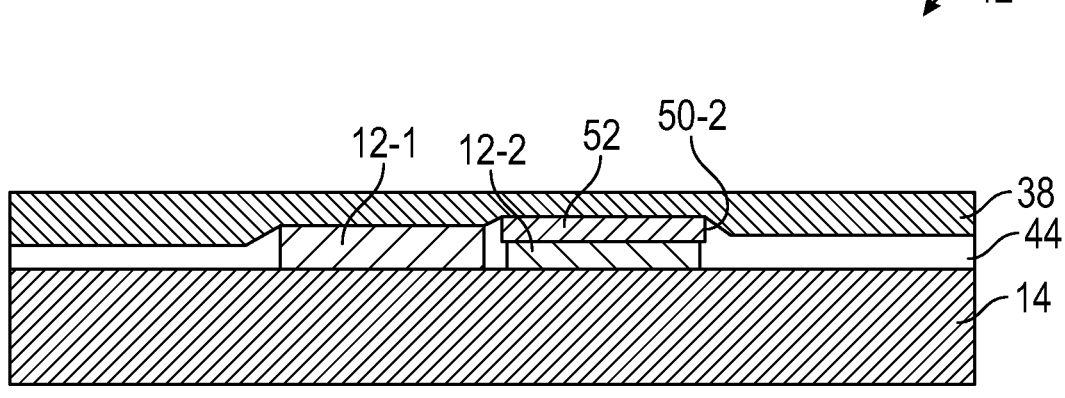
FIG. 4D is a cross-section of the LED package taken along the sectional line 4D-4D of FIG. 4A that includes the first LED chip and the second LED chip.

FIG. 4C is a cross-section of the LED package 42 taken along the sectional line 4C-4C of FIG. 4A that includes the second LED chip 12-2 and the third LED chip 12-3. FIG. 4D is a cross-section of the LED package 42 taken along the sectional line 4D-4D of FIG. 4A that includes the first LED chip 12-1 and the second LED chip 12-2. In certain embodiments, the second LED chip 12-2 may be configured to emit wavelengths of a single color, such as green, and the third LED chip 12-3 may be configured to emit wavelengths of a different single color, such as blue. In certain embodiments, blue and green LED chips may be formed of a same or similar material with similar dimensions. As illustrated in FIGS. 4C and 4D, a height of the second LED chip 12-2 above the submount 14 may be the same as a height of the third LED chip 12-3 above the submount 14, both of which are smaller than the height of the first LED chip 12-1. In this manner, additional cover structures 50-2 and 50-3 may be respectively arranged on the LED chips 12-2 and 12-3 to provide heights of the cover structures 50-2 and 50-3 that are within 10%, or 5%, or 1% of the height of the LED chip 12-1. In this regard, the support elements 52 of the cover structures 50-2 and 50-3 may have greater thicknesses than the support element 52 of the cover structure 50-4 of FIG. 4B. Turning back to FIG. 4A, the aggregate light-emitting surface for the LED package 42 including each of the LED chips 12-1 to 12-4 may collectively have a height above the submount 14 that deviates no more than 10%, or no more than 5%, or no more than 1% across the LED package 42. As described for FIG. 4B, the light-altering material 44 may be arranged on portions of the submount 14 that are outside mounting areas of the LED chips 12-1 to 12-4, and the encapsulant 38 may be provided on the light-altering material 44, on the LED chips 12-1 to 12-4, and on the cover structures 50-2 to 50-4.

Figure 5A:
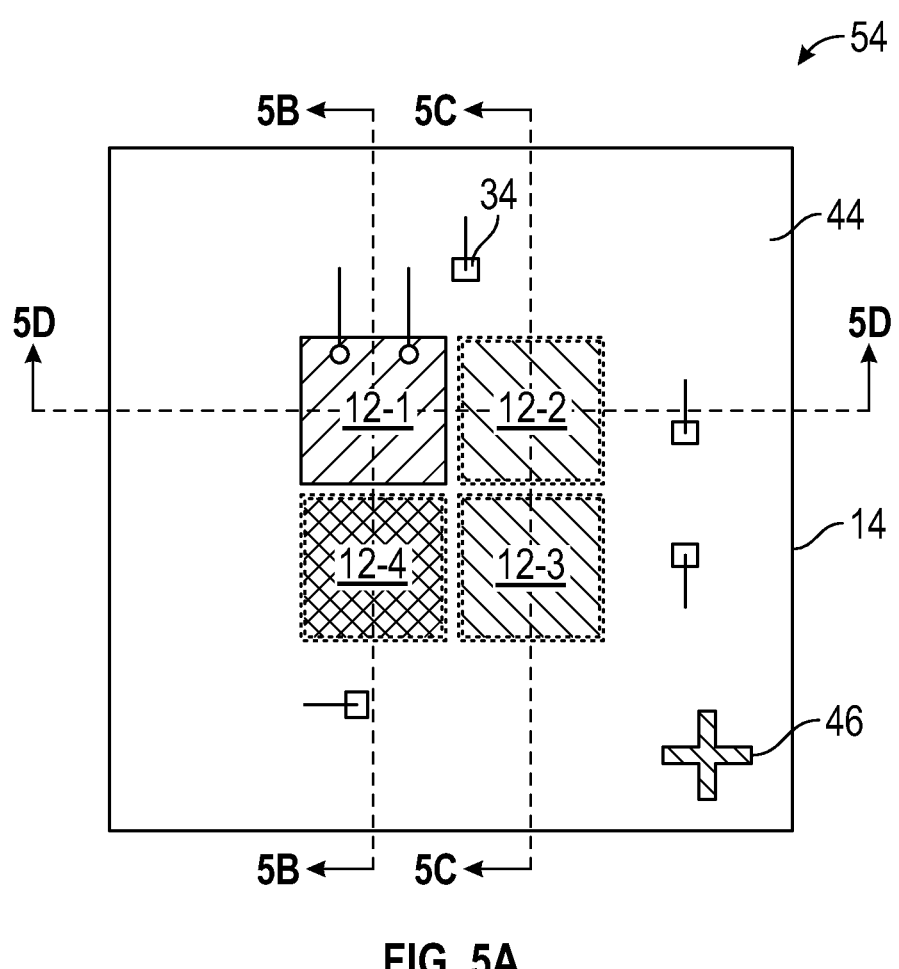
FIG. 5A is a top view of an LED package that is similar to the LED package of FIG. 4A and includes a different arrangement of the second and third LED chips.
Figure 5B:
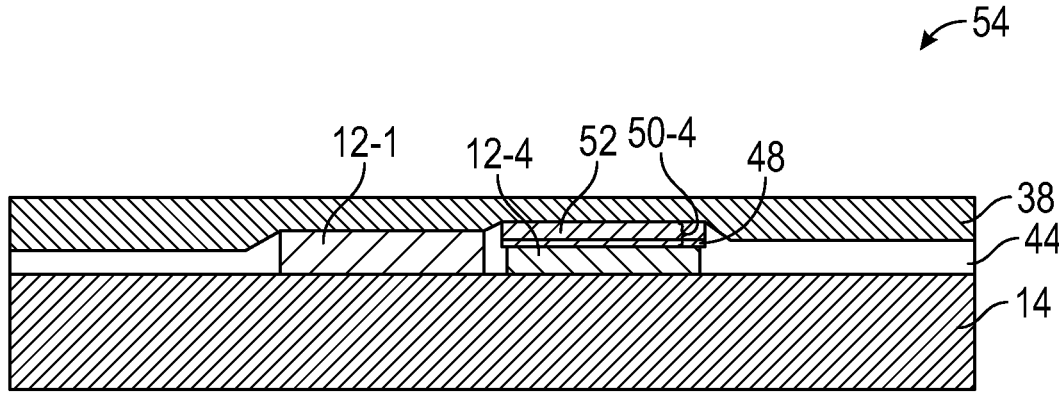
FIG. 5B is a cross-section of the LED package taken along the sectional line 5B-5B of FIG. 5A that includes the first LED chip and the fourth LED chip.
Figure 5C:
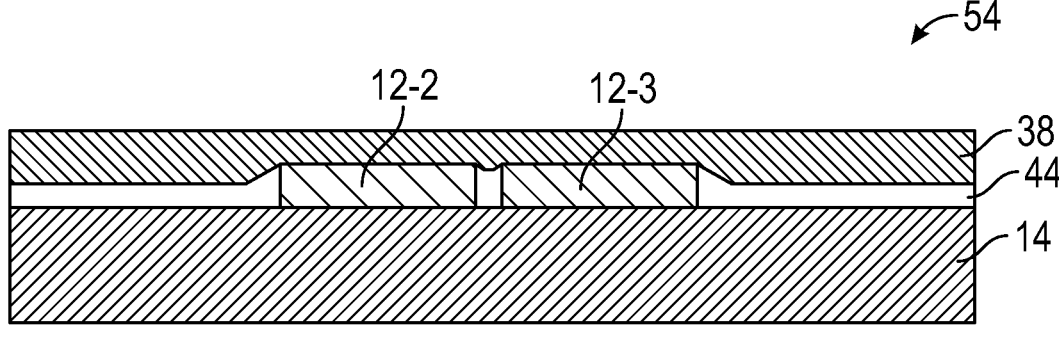
FIG. 5C is a cross-section of the LED package taken along the sectional line 5C-5C of FIG. 5A that includes the second LED chip and the third LED chip.
Figure 5D:
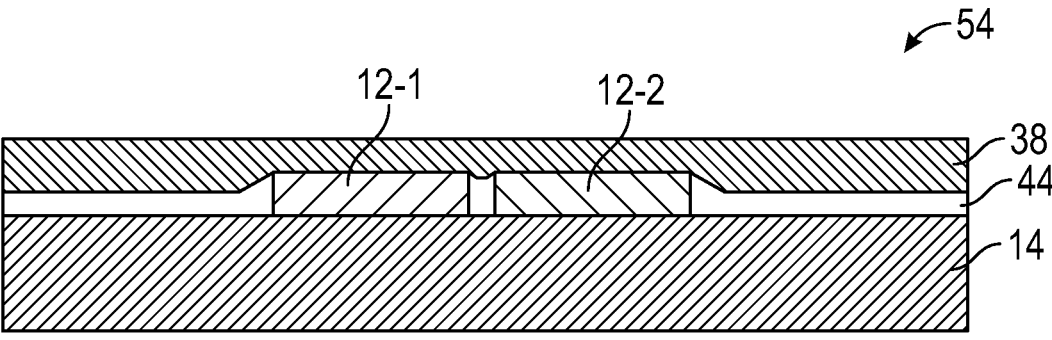
FIG. 5D is a cross-section of the LED package taken along the sectional line 5D-5D of FIG. 5A that includes the first LED chip and the second LED chip.

FIG. 5A is a top view of an LED package 54 that is similar to the LED package 42 of FIG. 4A and includes a different arrangement of the second and third LED chips 12-2, 12-3. FIG. 5B is a cross-section of the LED package 54 of taken along the sectional line 5B-5B of FIG. 5A that includes the first LED chip 12-1 and the fourth LED chip 12-4. FIG. 5C is a cross-section of the LED package 54 taken along the sectional line 5C-5C of FIG. 5A that includes the second LED chip 12-2 and the third LED chip 12-3. FIG. 5D is a cross-section of the LED package 54 taken along the sectional line 5D-5D of FIG. 5A that includes the first LED chip 12-1 and the second LED chip 12-2. The fourth LED chip 12-4 and cover structure 50-4 may be arranged as described above for FIG. 4B. In certain embodiments, the second LED chip 12-2 may be configured to emit wavelengths of a single color, such as green, and the third LED chip 12-3 may be configured to emit wavelengths of a different single color, such as blue. As illustrated in FIGS. 5C and 5D, the second and third LED chips 12-2 and 12-3 may be arranged with heights that are the same or within 10%, or within 5%, or within 1% of the height of the first LED chip 12-1 above the submount 14. In this regard, the aggregate light-emitting surface for the LED package 54 including each of the LED chips 12-1 to 12-4 may collectively have a height above the submount 14 that deviates no more than 10%, or no more than 5%, or no more than 1% across the LED package 54.

Figure 6A:
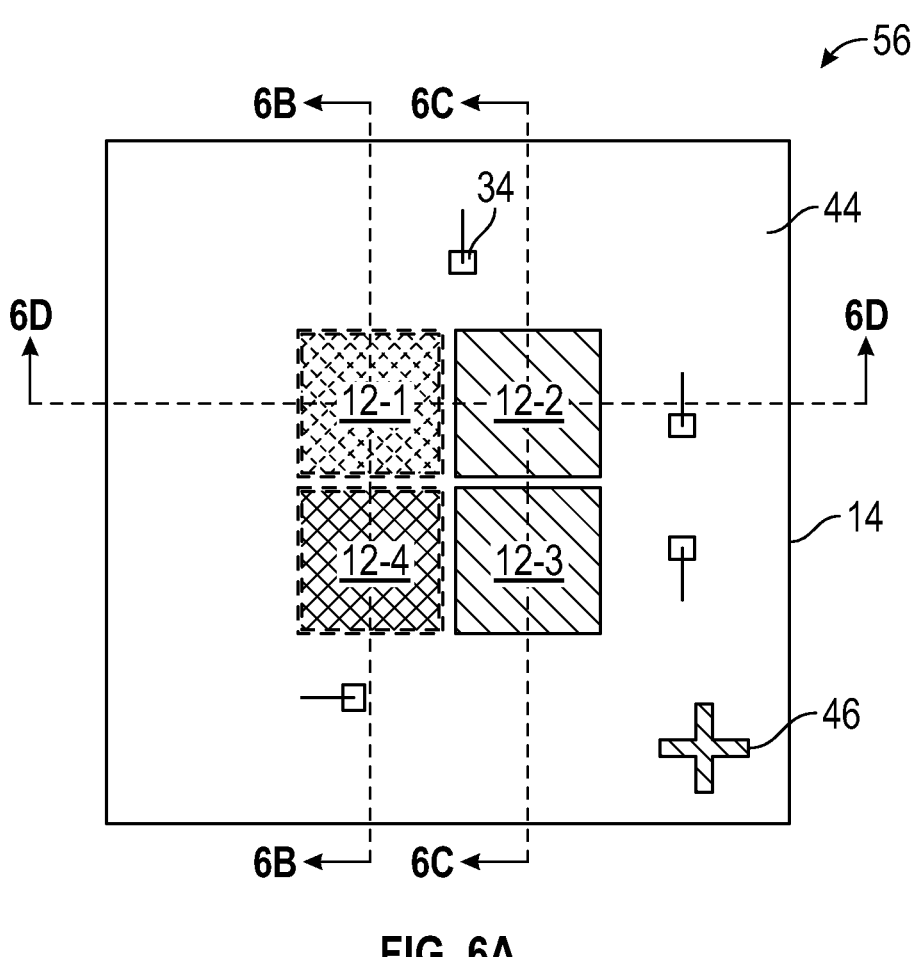
FIG. 6A is a top view of an LED package that is similar to the LED package of FIG. 5A and includes a different arrangement of the first LED chip.
Figure 6B:
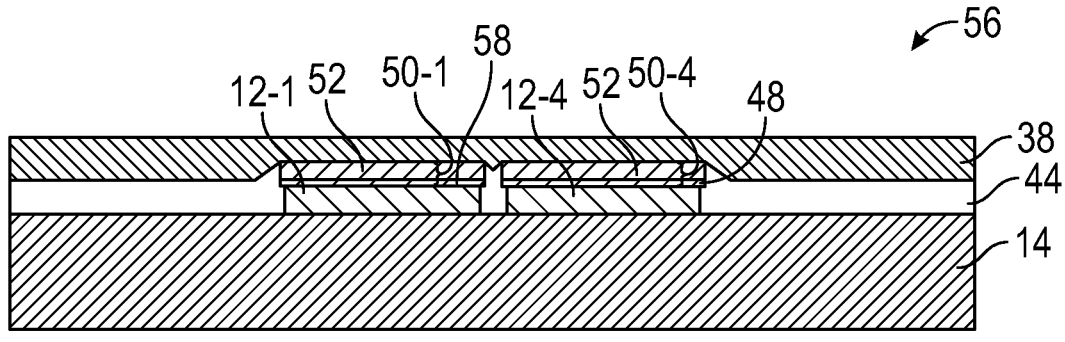
FIG. 6B is a cross-section of the LED package taken along the sectional line 6B-6B of FIG. 6A that includes the first LED chip and the fourth LED chip.
Figure 6C:
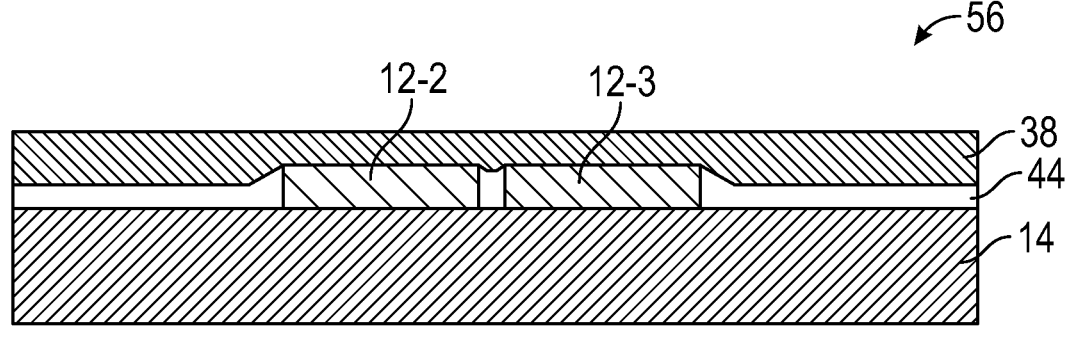
FIG. 6C is a cross-section of the LED package taken along the sectional line 6C-6C of FIG. 6A that includes the second LED chip and the third LED chip.
Figure 6D:
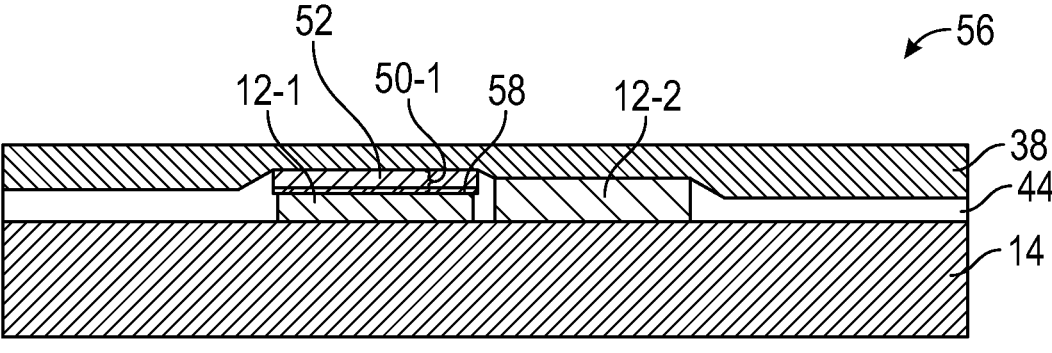
FIG. 6D is a cross-section of the LED package taken along the sectional line 6D-6D of FIG. 6A that includes the first LED chip and the second LED chip.

FIG. 6A is a top view of an LED package 56 that is similar to the LED package 54 of FIG. 5A and includes a different arrangement of the first LED chip 12-1. FIG. 6B is a cross-section of the LED package 56 taken along the sectional line 6B-6B of FIG. 6A that includes the first LED chip 12-1 and the fourth LED chip 12-4. FIG. 6C is a cross-section of the LED package 56 taken along the sectional line 6C-6C of FIG. 6A that includes the second LED chip 12-2 and the third LED chip 12-3. FIG. 6D is a cross-section of the LED package 56 taken along the sectional line 6D-6D of FIG. 6A that includes the first LED chip 12-1 and the second LED chip 12-2. The second LED chip 12-2, the third LED chip 12-3, the fourth LED chip 12-4, and the cover structure 50-4 may be arranged in a similar manner as FIG. 5B. In certain embodiments, the first LED chip 12-1 may be configured to primarily emit a wavelength-converted single color, such as red. For example, the first LED chip 12-1 may be configured to emit blue wavelengths in a similar manner as the fourth LED chip 12-4. A cover structure 50-1 for the LED chip 12-1 may include a lumiphoric material 58 and corresponding support element 52 where the lumiphoric material 58 may generate red emissions upon receiving blue light from the LED chip 12-1. The loading of the lumiphoric material 58 may be configured such that a majority of light exiting the cover structure 50-1 is red. The cover structures 50-1 and 50-4 may be configured to have heights above the submount 14 that are within 10%, or within 5%, or within 1% of the heights of the second and third LED chips 12-2 and 12-3, thereby providing increased uniformity of the aggregate light-emitting surface for the LED package 56.

Figure 7A:
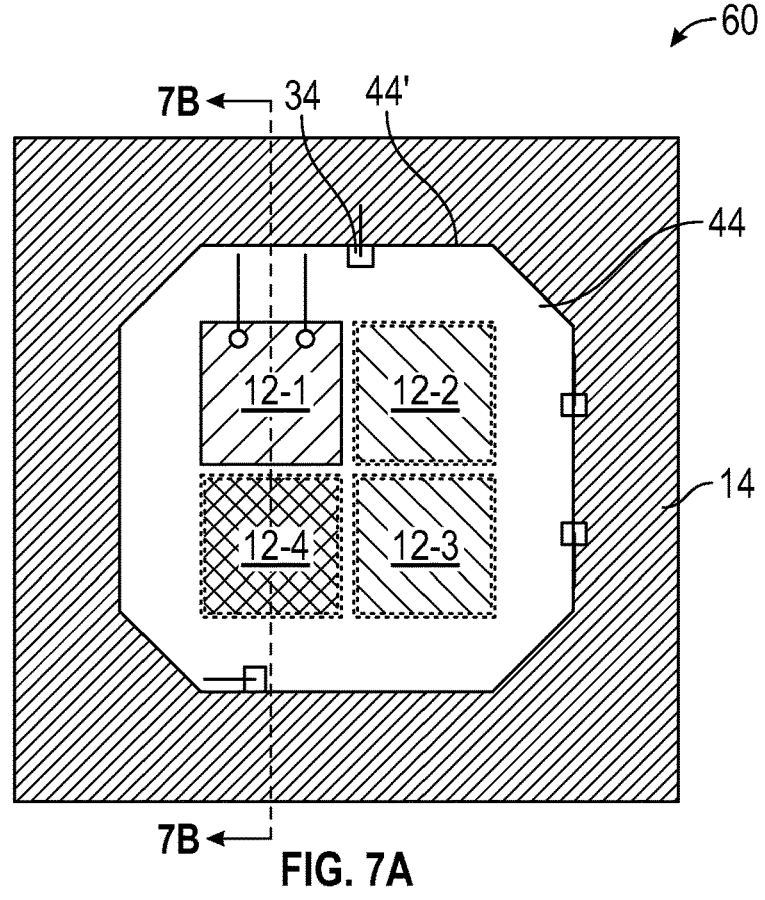
FIG. 7A is a top view of an LED package that is similar to the LED package of FIG. 4A and includes an arrangement where the light-altering material only partially covers the submount outside the LED chips.

FIG. 7A is a top view of an LED package 60 that is similar to the LED package 42 of FIG. 4A and includes an arrangement where the light-altering material 44 only partially covers the submount 14 outside the LED chips 12-1 to 12-4. In certain embodiments, the light-altering material 44 may be arranged to cover sides of each of the LED chips 12-1 to 12-4 without extending to peripheral edges of the submount 14. In this regard, laterally emitting light from the sidewalls of the LED chips 12-1 to 12-4 may be redirected by the light-altering material 44 while allowing other elements of the LED package to be in contact with portions of the submount 14 that are outside the light-altering material 44. In certain embodiments, peripheral edges 44' of the light-altering material 44 may form a ring that laterally surrounds the LED chips 12-1 to 12-4. The ring shape may embody a circle, a rectangle, a hexagon, an octagon, or even a non-uniform or non-geometric shape along the submount 14.

Figure 7B:
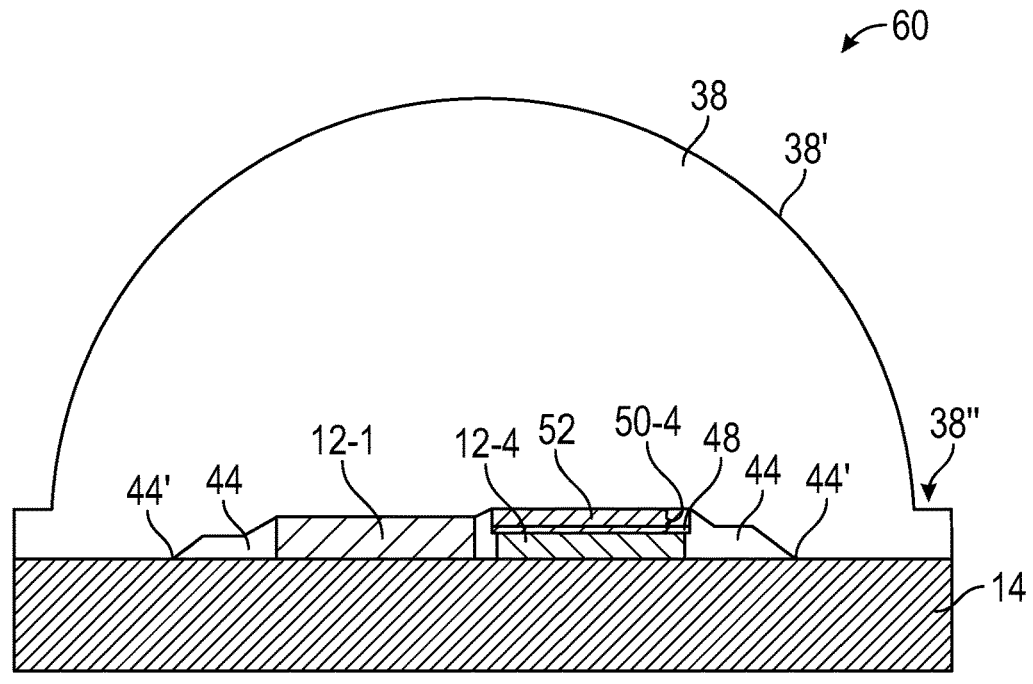
FIG. 7B is a cross-section of the LED package taken along the sectional line 7B-7B of FIG. 7A that includes the first LED chip and the fourth LED chip.

FIG. 7B is a cross-section of the LED package 60 taken along the sectional line 7B-7B of FIG. 7A that includes the first LED chip 12-1 and the fourth LED chip 12-4. As further illustrated in FIG. 7B, the encapsulant 38 for the LED package 60 may have a shape that is similar to FIG. 2, although the encapsulant 38 may have a shape that is similar to FIG. 3 in other embodiments. Since the peripheral edges 44' of the light-altering material 44 only partially cover the submount 14, other portions of the LED package 60 may contact the submount 14 outside the light-altering material 44. For example, the encapsulant 38 may be adhered to the light-altering material 44 and portions of the submount 14 outside the peripheral edge 44' of the light-altering material 44. Such an arrangement may prevent or reduce an amount of the light-altering material 44 that may be present along a flash portion 38" of the encapsulant 38. The flash portion 38" may be defined as a lateral extension of the encapsulant 38 that is outside the curved outer surface 38' and extends to the peripheral edges of the submount 14. The flash portion 38" is typically provided with a certain thickness to ensure suitable mechanical stability of the encapsulant 38. In this manner, if the light-altering material 44 is present at the flash portion 38", a same thickness of the flash portion 38" will position it higher above the submount 14. This may alter light emission from the LED package 60 by either raising the overall height of the encapsulant 38 or by providing a smaller size for the curved outer surface 38'. By reducing an amount of the light-altering material 44 that is present along the flash portion 38", such arrangements may be avoided. In certain embodiments, a height of the light-altering material 44 may decrease with increasing distance from peripheral edges of the LED chips 12-1 to 12-4.

Figure 8:
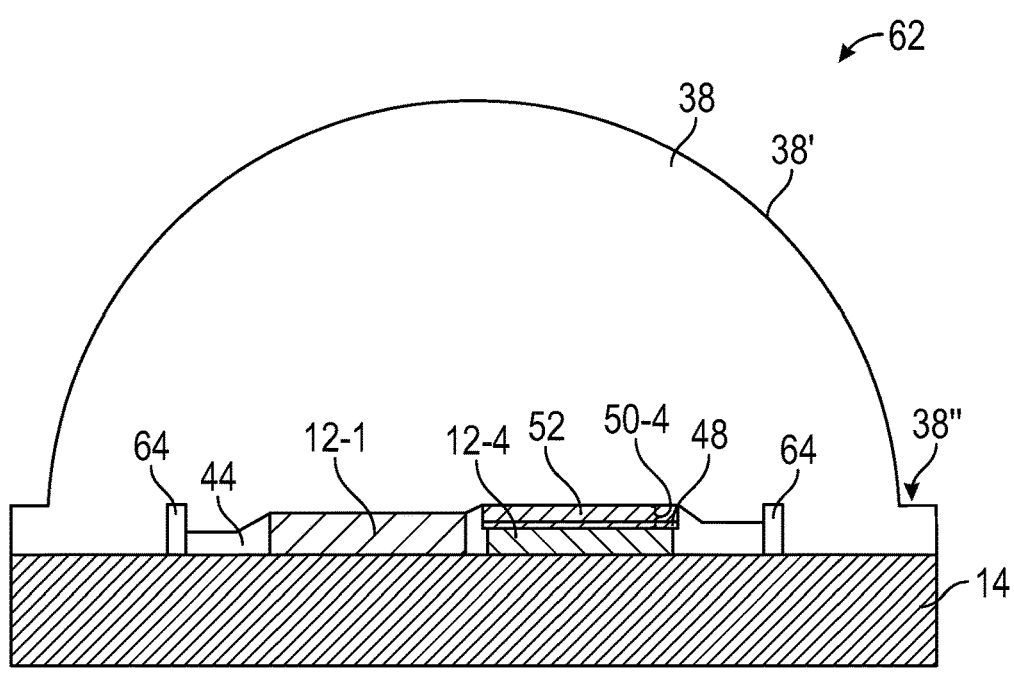
FIG. 8 is a cross-section of an LED package that is similar to the LED package of FIGS. 7A and 7B and further includes a dam that is arranged to confine the light-altering material to portions of the submount.

FIG. 8 is a cross-section of an LED package 62 that is similar to the LED package 60 of FIGS. 7A and 7B and further includes a dam 64 that is arranged to confine the light-altering material 44 to portions of the submount 14. In this manner, the dam 64 may define boundaries of the light-altering material 44 on the submount 14. The dam 64 may include a structure that is formed on the submount in a ring shape as described for the peripheral edge 44' of FIG. 7A. The light-altering material 44 may then be dispensed around the LED chips 12-1 to 12-4 and confined on the submount by the dam 64. In certain embodiments, the dam 64 may include a same material as the light-altering material 44. In other embodiments, the dam 64 may comprise a different material. For example, the light-altering material 44 may comprise $TiO_2$ particles in a binder of silicone while the dam 64 may also comprise $TiO_2$ particles in a binder of silicone or the dam 64 may comprise silicone without $TiO_2$ particles.

Figure 9:
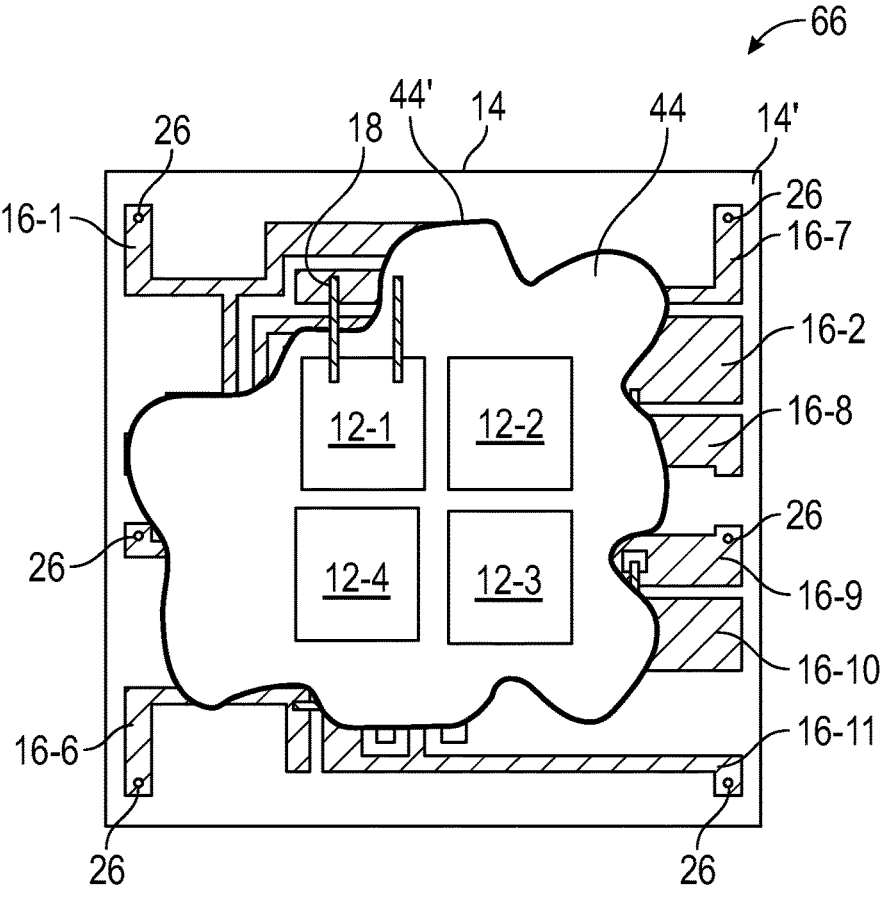
FIG. 9 is a top view of an LED package that is similar to the LED package of FIGS. 7A and 7B and includes another arrangement of the light-altering material.

FIG. 9 is a top view of an LED package 66 that is similar to the LED package 60 of FIGS. 7A and 7B and includes another arrangement of the light-altering material 44. In certain embodiments, the light-altering material 44 may be formed by separate dispensing steps that provide one or more portions of the light-altering material 44 as spaced apart droplets along the edges of one or more or the LED chips 12-1 to 12-4. The droplets may then be allowed to settle together by wicking and/or capillary action on the submount 14 to form a non-uniform or non-geometric shape along the submount 14. As illustrated in FIG. 9, the peripheral edges 44' of the light-altering material 44 form an irregular or non-geometric shape around the LED chips 12-1 to 12-4, while still reducing amounts of the light-altering material 44 that may be present near peripheral edges of the submount 14.

While certain ones of the above-described embodiments are provided in the context of LED chips with different emission wavelengths and/or various combinations of lumiphoric materials, the principles disclosed are applicable to optical layers beyond those that incorporate lumiphoric materials. For example, cover structures for LED chips may include one or more optical layers that embody antireflective layers or coatings, filter layers or coatings, and polarization layers or coatings individually or in various combinations to provide one or more of improved light output, increased light extraction, improved emission uniformity, and improved emission contrast for LED packages. In various aspects, the optical layers may include but are not limited to inorganic materials, dielectric materials, and metal materials.

As used herein, an antireflective layer or coating may include one or more layers that provide an index of refraction selected to reduce the reflection or refraction of light at an interface thereof. In certain embodiments, antireflective layers as disclosed herein may comprise single or multiple thin layers that transition from the index of refraction of one side of the interface to the other. In this regard, an antireflective layer may provide a graded index of refraction with values in a range between a first index of refraction associated with a first medium on one side of the interface and a second index of refraction associated with a second medium that is on the other side of the interface. Advantageously, by using the antireflective layer to transition between the different mediums, abrupt index of refraction changes may be avoided, which may reduce the amount of light reflected internally at the interface. Antireflective layers may include many different materials, including but not limited to one or more oxides of silicon (e.g., $SiO_2$), oxides of zirconium (e.g., $ZrO_2$), oxides of aluminum (e.g., $Al_2O_3$), oxides of titanium (e.g., $TiO_2$), oxides of indium (e.g., $In_2O_3$), indium tin oxide (ITO), silicon nitride (e.g., $SiN_x$), magnesium fluoride (e.g., $MgF_2$), cerium fluoride (e.g., $CeF_3$), flouropolymers, and combinations thereof. Relative thicknesses of antireflective layers or sub-layers within a multi-layer antireflective structure may comprise one or more combinations of quarter-wavelength and half-wavelength values of target light, for example the wavelength of light emitted by an LED chip and/or a wavelength of light provided by lumiphoric materials.

As used herein, a filter layer or coating may include multiple sub-layer arrangements with variable thickness and/or index of refraction differences that collectively provide the ability to pass certain wavelengths of light while reflecting or otherwise redirecting other wavelengths of light. In various arrangements, filter layers as described herein may include one or more of a band-pass filter, a high-pass filter, a low-pass filter, and a notch or band-stop filter. A band-pass filter may be configured to promote wavelengths within a particular range to pass through while reflecting wavelengths outside of the particular range. A low-pass filter may promote wavelengths below a certain value to pass through while reflecting higher wavelengths. A high-pass filter may promote wavelengths above a certain value to pass through while reflecting lower wavelengths. Finally, a notch or band-stop filter may promote wavelengths within a particular range to be reflected while promoting wavelengths outside of the particular range to pass through. By way of non-limiting example, a band-pass filter may include alternating layers with alternating index of refraction materials (e.g., high-low) where relative layer thicknesses are chosen specifically to promote constructive interference for a specific wavelength band while reflecting wavelengths outside of the specific wavelength band. Filter layers according to the present disclosure may include any of the materials and combinations thereof as provided for the antireflective layers described above.

As used herein, a polarization layer or coating may refer to a structure or filter configured to produce polarized light for a variety of purposes, including reducing glare for human and/or machine vision. As described herein, polarization structures may be formed on one or more surfaces within an LED package. For example, polarization structures may be formed as a layer of film provided on a cover structure for LED chips and/or in an integrated manner with a surface of the cover structure. Polarization structures may refer to structures that are capable of receiving unpolarized light and providing polarized light that exits the polarization structures. As used herein, unpolarized light may refer to light that is a collection of randomly polarized light waves, whereas polarized light may refer to light that is provided with a particular polarization or geometrical orientation, such as a linear polarization, plane polarization, and/or a circular polarization. Exemplary structures may include nanostructures formed at a surface of a film and/or another element of the LED package through which light passes. As used herein a nanostructure may refer to a feature or a pattern of features in or on a surface such that the features deviate from that surface in the nanoscale, such as in a range from 0.1 nm to 100 nm. Orientations of such nanostructures may be arranged that determine a particular polarization angle for light passing therethrough. The nanostructures may be formed by a subtractive process such as etching or by an additive process such as patterned deposition. In certain embodiments, the polarization structure may embody a light-polarizing film, with surface nanostructures, that is formed on an element, such as a cover structure of the LED package. The polarization film may comprise a dielectric film, such as silicon dioxide ($SiO_2$) or the like. In other embodiments, the polarization structure may embody a surface of an existing element of the LED package that includes such nanostructures. For example, in the context of a cover structure that includes a light-transparent superstrate or support element, the polarization structure may embody a light-polarizing film that is deposited or otherwise formed on a surface of the support element, a structure that is etched into a surface of the support element, and/or a patterned structure that is on the surface of the support element.

Figure 10:
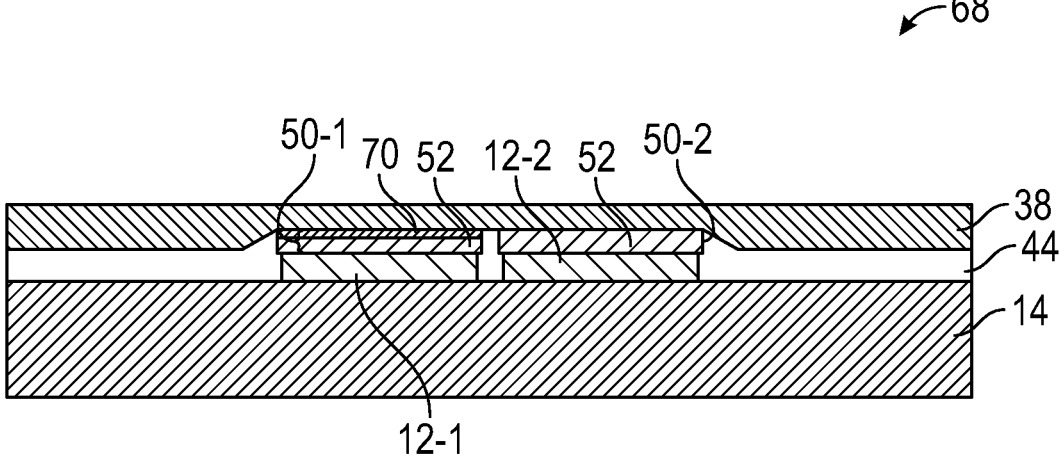
FIG. 10 is cross-sectional view of an LED package that is similar to the LED package of FIG. 4A and where a first LED chip includes a cover structure that includes an optical layer of one or more antireflective layers, one or more filter layers, one or more polarization layers, or combinations thereof.

FIG. 10 is cross-sectional view of an LED package 68 that is similar to the LED package 42 of FIG. 4A and where the LED chip 12-1 includes a cover structure 50-1 that includes an optical layer 70. As described above, the optical layer 70 may embody one or more antireflective layers, one or more filter layers, one or more polarization layers, or combinations thereof. The optical layer 70 may be provided on a surface of the support element 52 of the cover structure 50-1. In this manner, light emissions from the LED chip 12-1 may pass through the cover structure 50-1 and the optical layer 70. In certain embodiments, the LED chip 12-2 of the LED package 68 may be provided with a cover structure 50-2 that only includes a support element 52. In order to provide an aggregate light-emitting surface for the LED package 68 with improved uniformity, relative heights or thicknesses of the support elements 52 in each of the cover structures 50-1, 50-2 may be different from one another. In certain embodiments, the support element 52 of the cover structure 50-1 may be provided with a smaller thickness than the support element 52 of the cover structure 50-2. In this manner, a thickness of the optical layer 70 and any thickness deviations between the LED chips 12-1, 12-2 may be accounted for while still maintaining a relatively uniform light emission surface. In certain embodiments, heights of the cover structures 50-1, 50-2 above the submount 14 may be within 10%, or 5%, or 1% of one another to provide such an aggregated light emission surface.

Figure 11:
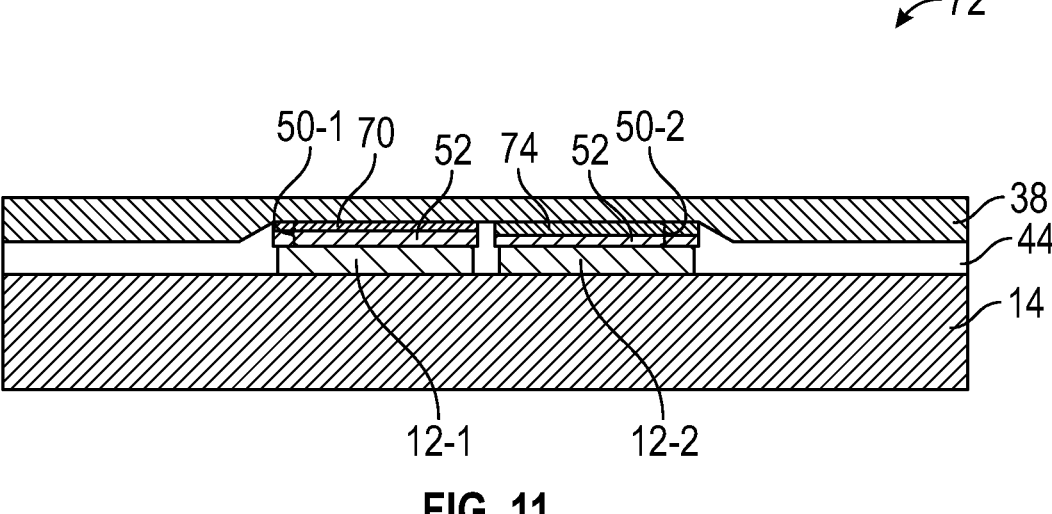
FIG. 11 is cross-sectional view of an LED package that is similar to the LED package of FIG. 10 and where the cover structure for a second LED chip includes another optical

FIG. 11 is cross-sectional view of an LED package 72 that is similar to the LED package 68 of FIG. 10 and where the cover structure 50-2 for the second LED chip 12-2 includes another or second optical layer 74. In a similar manner to the optical layer 70 (referred to hereafter as the first optical layer), the second optical layer 74 may embody one or more antireflective layers, one or more filter layers, one or more polarization layers, or combinations thereof. The first and second optical layers 70, 74 may comprise a same type of optical layer or a different type depending on the desired emission properties for the LED package 72. In certain embodiments, the second optical layer 74 may have a greater thickness than the first optical layer 70. In order to account for this thickness difference and any thickness deviations between the LED chips 12-1, 12-2, the support element 52 of the cover structure 50-1 may be provided with a different thickness than the support element 52 of the cover structure 50-2. By way of example, if the LED chips 12-1, 12-2 have a same thickness, the support element 52 of the cover structure 50-1 may have a greater thickness than the support element 52 of the cover structure 50-2. In certain embodiments, heights of the cover structures 50-1, 50-2 above the submount 14 may be within 10%, or 5%, or 1% of one another to provide an aggregated light emission surface with improved uniformity.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A light-emitting diode (LED) package comprising:
a submount including a first side and a second side that opposes the first side;
a plurality of metal traces on the first side of the submount;
a plurality of LED chips mounted on the first side and electrically coupled with the plurality of metal traces, wherein:
   a first LED chip of the plurality of LED chips is mounted to and electrically coupled with a first trace of the plurality of metal traces, and the first LED chip is further electrically coupled with a second trace of the plurality of metal traces by a wire bond; and
   a second LED chip of the plurality of LED chips is mounted to and electrically coupled to a third trace and a fourth trace of the plurality of metal traces, wherein a height of the first LED chip above the submount is more than 25% of a height of the second LED chip above the submount;
a jumper wire bond electrically coupled between the first trace and a fifth trace of the plurality of metal traces, the jumper wire bond extending over the third trace; and
a cover structure that is registered with the second LED chip, the cover structure comprising a support element that is light-transparent to light from the second LED chip, and a height of the cover structure at a planar upper surface of the support element is within 20% of the height of the first LED chip.

2. The LED package of claim 1, wherein the jumper wire bond is one of a plurality of jumper wire bonds electrically coupled between the first trace and the fifth trace.

3. The LED package of claim 1, wherein the first trace, the second trace, the wire bond, the fifth trace, and the jumper wire bond form an electrically conductive path for the first LED chip that extends along the first side from a peripheral edge of the submount to an opposing peripheral edge of the submount.

4. The LED package of claim 1, wherein the height of the cover structure is within 5% of the height of the first LED chip.

5. The LED package of claim 1, wherein the cover structure comprises a lumiphoric material and the support element is light-transmissive to light from the lumiphoric material.

6. A light-emitting diode (LED) package comprising:
a submount including a first side and a second side that opposes the first side;
a first LED chip and a second LED chip arranged on the first side of the submount; and
a cover structure covering a top surface of the second LED chip such that the second LED chip is arranged between the cover structure and the submount, the cover structure comprising a support element that is light-transparent to light from the second LED chip, wherein a height of the first LED chip above the submount is greater than a height of the second LED chip above the submount by at least 25%, and a height of the cover structure at a planar upper surface of the support element above the submount is within 10% of the height of the first LED chip.

7. The LED package of claim 6, wherein the height of the cover structure is within 5% of the height of the first LED chip.

8. The LED package of claim 6, wherein the cover structure comprises a lumiphoric material and the support element is light-transmissive to light from the lumiphoric material.

9. The LED package of claim 8, further comprising a third LED chip arranged on the first side of the submount and an additional cover structure that is arranged on the third LED chip, wherein the height of the first LED chip above the submount is greater than a height of the third LED chip above the submount, and a height of the additional cover structure above the submount is within 10% of the height of the first LED chip.

10. The LED package of claim 9, wherein the additional cover structure comprises a lumiphoric material that is different from the lumiphoric material of the cover structure.

11. The LED package of claim 10, wherein:

the second LED chip and the lumiphoric material of the cover structure are configured to provide white light that is a mixture of light from the second LED chip and the lumiphoric material; and the third LED chip and the lumiphoric material of the additional cover structure are configured to provide light that is primarily a single color such that a majority of light that exits the additional cover structure comprises wavelength-converted light.

12. The LED package of claim 6, further comprising a light-altering material on sidewalls of the first LED chip and the second LED chip and on portions of the submount that are outside mounting areas of the first LED chip and the second LED chip.

13. The LED package of claim 12, further comprising an encapsulant that is arranged on the light-altering material, the first LED chip, and the cover structure.

14. The LED package of claim 12, wherein the light-altering material is arranged to entirely extend from the first LED chip and the second LED chip to peripheral edges of the submount.

15. The LED package of claim 12, wherein the light-altering material is arranged to only partially extend from the first LED chip and the second LED chip toward peripheral edges of the submount.

16. The LED package of claim 15, further comprising a dam on the submount that defines boundaries of the light-altering material.

17. The LED package of claim 12, wherein peripheral edges of the light-altering material form a non-geometric shape along the submount.

18. A light-emitting diode (LED) package comprising:

a submount;

a first LED chip and a second LED chip that are arranged on the submount, wherein a height of the first LED chip above the submount is greater than a height of the second LED chip above the submount by at least 25%;

a first cover structure covering a top surface of the first LED chip, the first cover structure comprising a first support element that is transparent to light generated by the first LED chip; and a second cover structure covering a top surface of the second LED chip, the second cover structure comprising a second support element that is transparent to light generated by the second LED chip;

wherein the first support element comprises a thickness that is different than a thickness of the second support element, and a height of the first cover structure at a planar upper surface of the first support element above the submount is within 10% of a height of the second cover structure at a planar upper surface of the second support element above the submount.

19. The LED package of claim 18, wherein the first cover structure comprises a lumiphoric material.

20. The LED package of claim 18, wherein the first cover structure comprises a first optical layer that includes one or more of an antireflective layer, a filter layer, and a polarization layer.

21. The LED package of claim 20, wherein the second cover structure comprises a second optical layer that includes one or more of an antireflective layer, a filter layer, and a polarization layer.

22. The LED package of claim 18, further comprising a light-altering material on sidewalls of the first LED chip and the second LED chip and on portions of the submount that are outside mounting areas of the first LED chip and the second LED chip.

23. The LED package of claim 22, further comprising an encapsulant that is arranged on the light-altering material, the first cover structure, and the second cover structure.

*    *    *    *    *